United States Patent
Hsu et al.

(10) Patent No.: US 11,908,846 B1
(45) Date of Patent: Feb. 20, 2024

(54) DISPLAYS WITH NON-PERIODIC OPAQUE STRUCTURES

(71) Applicant: Apple Inc., Cupertino, CA (US)

(72) Inventors: Yung-Yu Hsu, San Jose, CA (US); Chaohao Wang, Sunnyvale, CA (US); Jonathan C. Moisant-Thompson, San Jose, CA (US); Kuan H. Lu, Santa Clara, CA (US); Mingjing Ha, Cupertino, CA (US); Paul S. Drzaic, Morgan Hill, CA (US); Yang Li, San Jose, CA (US); Yi-Pai Huang, Cupertino, CA (US); Nathaniel T. Lawrence, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 425 days.

(21) Appl. No.: 17/009,158

(22) Filed: Sep. 1, 2020

Related U.S. Application Data

(60) Provisional application No. 62/943,076, filed on Dec. 3, 2019.

(51) Int. Cl.
*H01L 25/16* (2023.01)

(52) U.S. Cl.
CPC .................. *H01L 25/167* (2013.01)

(58) Field of Classification Search
CPC ............. H01L 25/167; H01L 27/3244; H01L 27/3246; H01L 27/3279; H01L 51/5256
USPC ............................................. 257/91; 438/22
See application file for complete search history.

(56) References Cited

U.S. PATENT DOCUMENTS

| | | | |
|---|---|---|---|
| 6,977,705 B1 | 12/2005 | Chiang et al. | |
| 8,284,332 B2 | 10/2012 | Geaghan et al. | |
| 9,341,846 B2 | 5/2016 | Popovich et al. | |
| 9,519,154 B2 | 12/2016 | Bell | |
| 2008/0165267 A1 | 7/2008 | Cok | |
| 2012/0300307 A1 | 11/2012 | Borrelli et al. | |
| 2015/0155434 A1* | 6/2015 | Kim | H01L 33/10 438/29 |
| 2015/0380470 A1* | 12/2015 | Lee | H10K 59/351 257/40 |
| 2018/0052276 A1 | 2/2018 | Klienman et al. | |
| 2019/0013307 A1* | 1/2019 | Wu | G09G 3/32 |
| 2019/0041658 A1 | 2/2019 | Gollier et al. | |
| 2019/0250450 A1 | 8/2019 | Li | |

(Continued)

*Primary Examiner* — Didarul A Mazumder
(74) *Attorney, Agent, or Firm* — Treyz Law Group, P.C.; Joseph F. Guihan

(57) ABSTRACT

A display may include light-emitting components such as light-emitting diodes on a transparent substrate. Conductive signal paths between the light-emitting components, driver integrated circuits for controlling the light-emitting components, and the light-emitting components themselves may be opaque. To mitigate diffraction artifacts caused by the opaque components, the opaque footprint of the display may be selected to include non-periodic portions. The non-periodic portions increase randomness and reduce periodicity within the opaque footprint, which mitigates perceptible diffraction artifacts when viewing the display. One or both of the component mounting portions and interconnect portions of the opaque footprint may be non-periodic. The component mounting portions may have random shapes. The interconnect portions may follow random paths between the component mounting portions.

20 Claims, 20 Drawing Sheets

(56) References Cited

U.S. PATENT DOCUMENTS

2019/0305251 A1* 10/2019 Han .................... H01L 51/5246
2020/0027930 A1* 1/2020 Yuan ..................... H01L 51/56

* cited by examiner

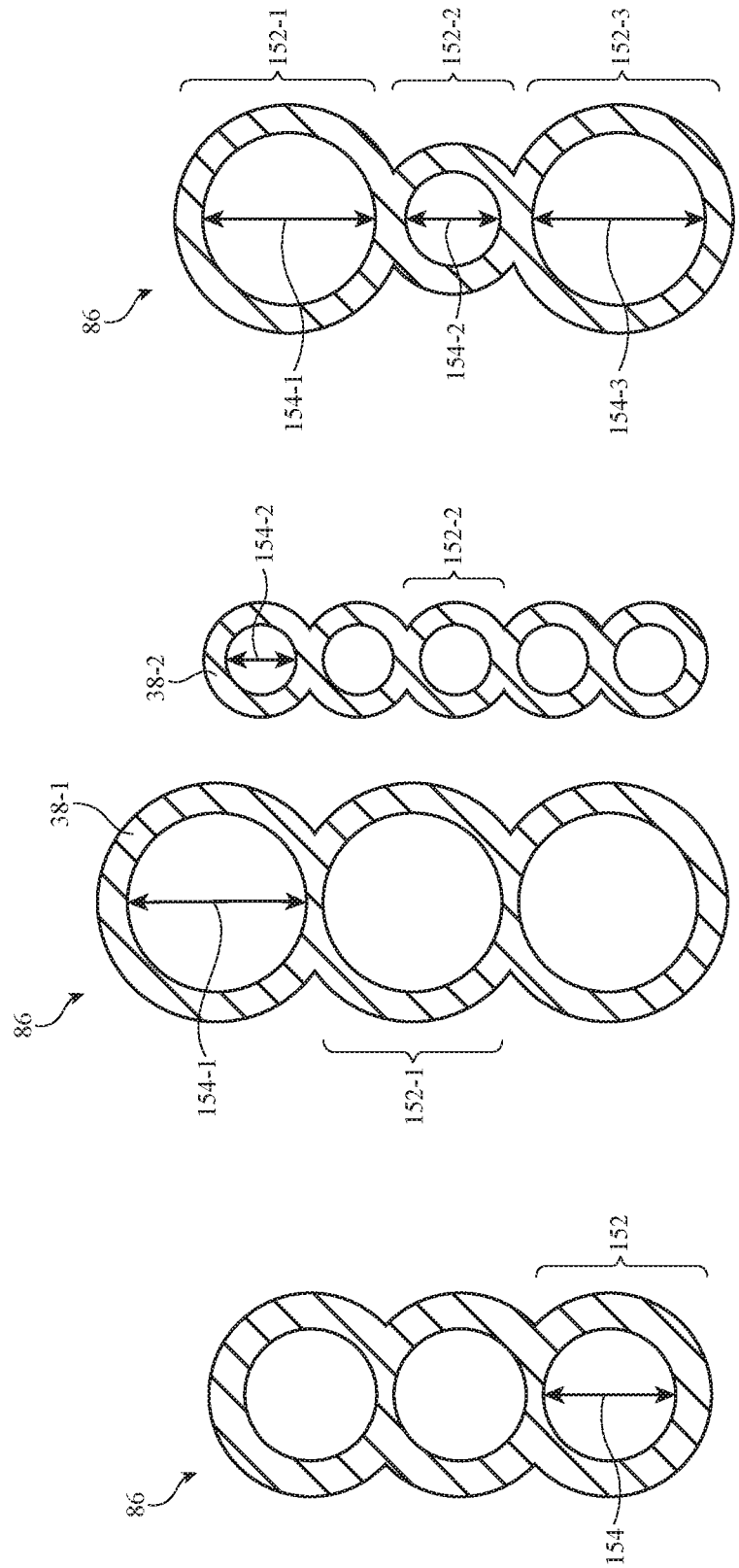

DISPLAYS WITH NON-PERIODIC OPAQUE STRUCTURES

This application claims the benefit of provisional patent application No. 62/943,076, filed Dec. 3, 2019, which is hereby incorporated by reference herein in its entirety.

BACKGROUND

This relates generally to displays, and, more particularly, to displays with opaque and transparent structures.

Electronic devices often include displays. For example, cellular telephones and portable computers include displays for presenting information to users. An electronic device may have a light-emitting diode display based on light-emitting diode pixels or a liquid crystal display based on liquid crystal pixels.

Displays may include both transparent and opaque structures. If care is not taken, diffraction of light passing through the transparent structures may cause visible artifacts.

It would therefore be desirable to be able to provide improved displays.

SUMMARY

A display may comprise opaque or semi-opaque components that form periodic patterns due to their placement on a display substrate. These components may include light-emitting components such as light-emitting diodes on a transparent substrate. Conductive signal paths between the light-emitting components, driver integrated circuits for controlling the light-emitting components, and the light-emitting components themselves may be opaque. These repetitive, opaque structures with small transparent gaps between them may create visible artifacts when viewing light through the display. Diffraction of environmental light that passes through the display to the viewer may result in undesirable visible artifacts such as rainbow effects and diffraction spikes.

To mitigate diffraction artifacts, the opaque footprint of the display may be selected to include non-periodic optical features (e.g., to include randomness and reduce periodicity). Reducing periodicity in this manner mitigates perceptible diffraction artifacts when viewing the display.

The opaque footprint of the display may include component mounting portions and interconnect portions that extend between the component mounting portions. The component mounting portions may overlap opaque components such as the driver integrated circuits and light-emitting diodes. The interconnect portions may overlap signal paths for conveying signals between the components or may be formed by the signal paths themselves.

The opaque footprint may have component mounting portions with randomized shapes. Each of the component mounting portions may be connected by interconnect portions that follow a randomized path. A unit cell with a given number of unique randomized shapes for the component mounting portions and interconnect portions may be repeated across the opaque footprint.

Reflective displays may also possess periodic elements that can cause visible diffraction when illuminated by environmental light. This diffraction may be highly visible when the display is not emitting light, but may also combine in an undesirable way with light emitted from the display. Similar to the transparent display case, randomized optical features may be included in the reflective display to suppress diffraction by environmental light. Additionally, the placement of the elements on the display substrate can be adjusted to minimize periodic features and to suppress diffraction.

BRIEF DESCRIPTION OF THE DRAWINGS

FIG. 16A is a top view of an illustrative interconnect portion with a repeated ring structure in accordance with an embodiment.

FIG. 16B is a top view of an illustrative interconnect portion showing how adjacent signal paths may have repeated ring structures of different sizes in accordance with an embodiment.

FIG. 16C is a top view of an illustrative interconnect portion with a repeated ring structure having rings of different sizes in accordance with an embodiment.

DETAILED DESCRIPTION

Figure 1:
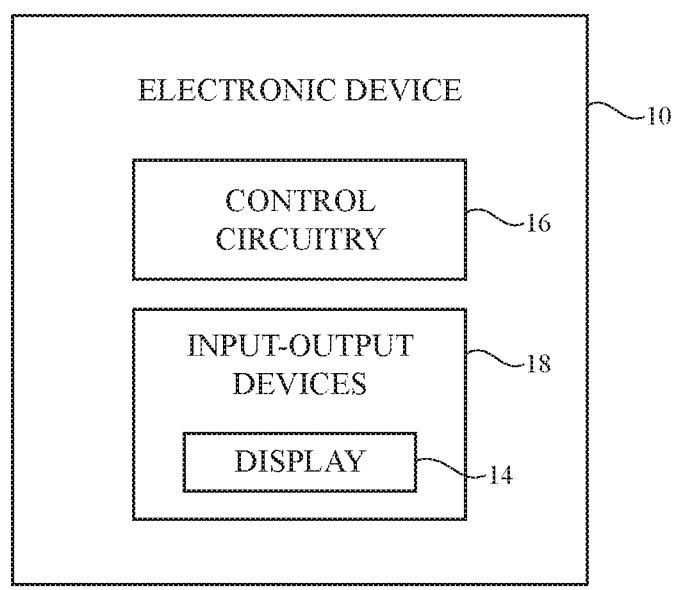
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a virtual reality device, an augmented reality device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include wired and/or wireless communications circuitry (e.g., antennas and associated radio-frequency transceiver circuitry such as cellular telephone communications circuitry, wireless local area network communications circuitry, etc.). The communications circuitry may allow device 10 to communicate with other electronic devices.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be an organic light-emitting diode display, a display formed from an array of discrete light-emitting diodes each formed from a crystalline semiconductor die (sometimes referred to as micro-light-emitting diodes), or any other suitable type of display. Configurations in which the pixels of display 14 include light-emitting diodes are sometimes described herein as an example. This is, however, merely illustrative. Any suitable type of display may be used for device 10, if desired (e.g., a liquid crystal display).

In some cases, a display may be at least partially transparent. A transparent display may, for example, allow a viewer to see external objects through the display in addition to the displayed content from the display. In other words, a viewer on a first side of the display may be able to see external objects that are on a second, opposing side of the display by viewing the external objects through the transparent display.

Figure 2:
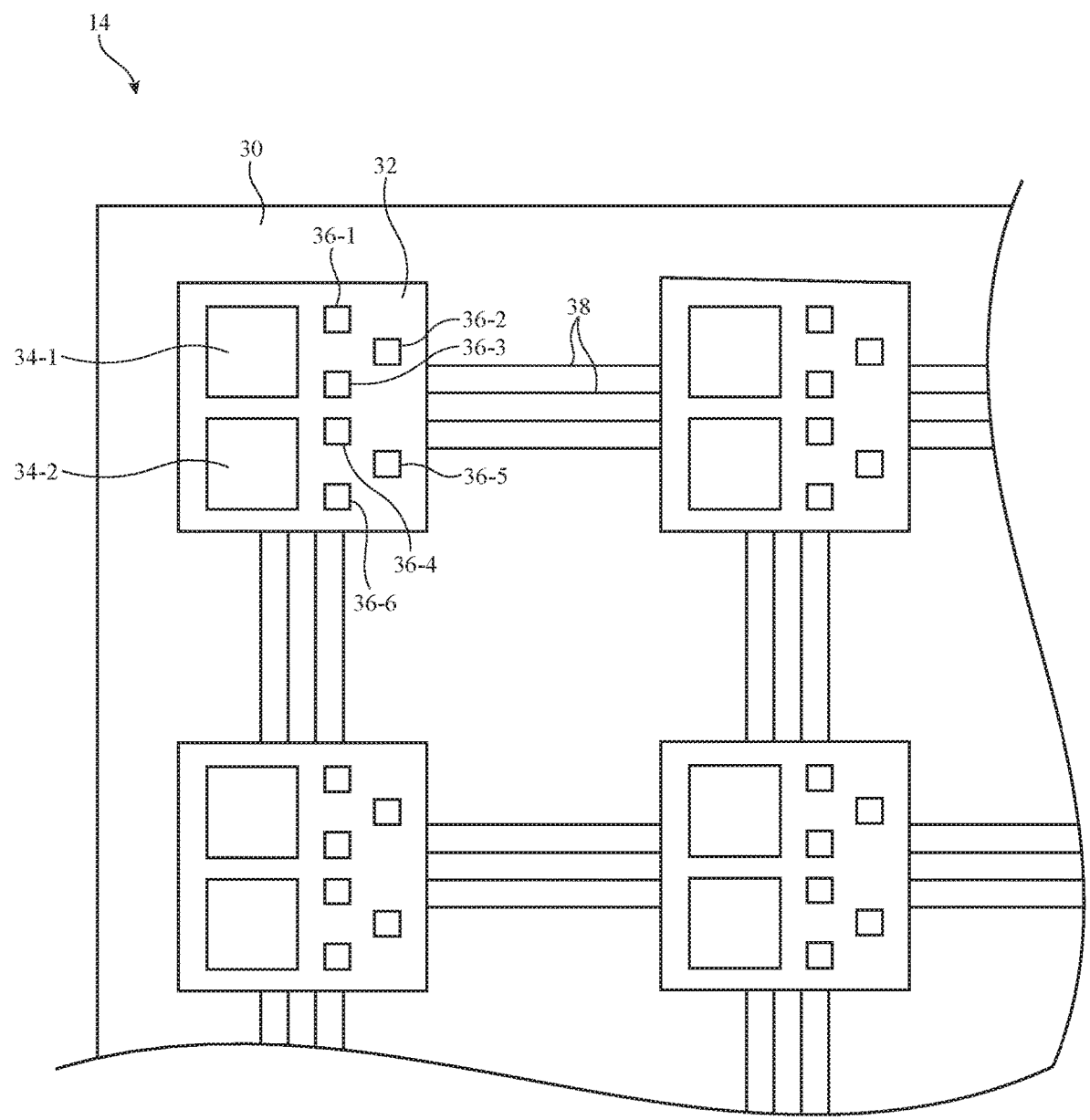
FIG. 2 is a top view of an illustrative display having driver integrated circuits and light-emitting diodes mounted in component mounting regions in accordance with an embodiment.

FIG. 2 is a top view of an illustrative transparent display. As shown in FIG. 2, display 14 may include a transparent substrate 30. The transparent substrate may be formed from glass, a transparent polymer material, sapphire, or any other desired material. The incident light transmission of the substrate may be greater than 70%, greater than 80%, greater than 90%, greater than 95%, greater than 99%, etc. The substrate is therefore referred to as a transparent substrate.

An array of display pixels may be formed on the transparent substrate. In the example of FIG. 2, the display pixels may be formed from an array of light-emitting diodes (LEDs) 36. The light-emitting diodes may be micro-light-emitting diodes (e.g., light-emitting diode semiconductor dies having footprints of about 10 micron×10 micron, more than 5 micron×5 micron, less than 100 micron×100 micron, less than 20 micron×20 micron, less than 10 micron×10 micron, or other suitable sizes). The light-emitting diodes may be controlled by respective driver integrated circuits (driver ICs) such as driver integrated circuits 34.

The light-emitting diodes may be mounted on component support regions 32 of the substrate. Component support regions 32 may be formed from one or more dielectric layers. Metal interconnect layers (traces) and vias may be formed on the various dielectric layers of the component support region, allowing signal routing between the components mounted in the component support region. Component support region 32 may also be referred to as component mounting region 32, island 32, island region 32, etc.

In the example of FIG. 2, first and second driver integrated circuits 34-1 and 34-2 are mounted to each component support region 32. Similarly, six light-emitting diodes 36 may be mounted to each component support region 32. Light-emitting diodes 36-1, 36-2, and 36-3 may be controlled by driver integrated circuit (IC) 34-1. Light-emitting diodes 36-1, 36-2, and 36-3 may be red, green, and blue light-emitting diodes respectively in one example. Light-emitting diodes 36-4, 36-5, and 36-6 may be controlled by driver integrated circuit (IC) 34-2. Light-emitting diodes 36-4, 36-5, and 36-6 may be red, green, and blue light-emitting diodes respectively in one example.

The example of two driver ICs and six light-emitting diodes on each component mounting region is merely illustrative. If desired, only one driver IC and only three light-emitting diodes may be mounted on each island 32. Each driver IC may control three light-emitting diodes, more than three light-emitting diodes, or less than three light-emitting diodes. Any desired number of light-emitting diodes and associated driver ICs may be mounted on each island 32.

Conductive signal paths 38 may be formed between the component mounting regions 32. The conductive signal paths 38 may be formed from a metal material such as copper, indium tin oxide (ITO) or another desired material. The conductive signal paths may pass signals (e.g., ground signals, power supply signals, data signals, control signals, etc.) between the components on the component mounting regions. The conductive signal paths may be formed on one or more dielectric layers (e.g., dielectric layers common to islands 32, dielectric layers formed separately from islands 32) or may be formed directly on transparent substrate 30.

As previously mentioned, substrate 30 may be transparent to allow display 14 to serve as a transparent display. However, the additional display components formed on the substrate may not necessarily be transparent. Component mounting regions 32, driver ICs 34, light-emitting diodes 36, and/or signal paths 38 may all be opaque (e.g., may transmit less than 40% of incident light, may transmit less than 30% of incident light, may transmit less than 20% of incident light, may transmit less than 10% of incident light, may transmit less than 5% of incident light, may transmit less than 1% of incident light, etc.). The amount of area occupied by the opaque components may be small enough that the overall display still serves as a transparent display. The opaque components of display 14 may define an opaque footprint on transparent substrate 14. The portions of the display within the opaque footprint may be substantially opaque (e.g., may transmit less than 40% of incident light, may transmit less than 30% of incident light, may transmit less than 20% of incident light, may transmit less than 10% of incident light, may transmit less than 5% of incident light, may transmit less than 1% of incident light, etc.). The portions of the display outside of the opaque footprint may be substantially transparent (may transmit more than 70% of incident light, may transmit more than 80% of incident light, may transmit more than 90% of incident light, may transmit more than 95% of incident light, may transmit more than 99% of incident light, etc.).

The overall area of the opaque footprint of the display may be less than 80% of the total area of the display, less than 50% of the total area of the display, less than 40% of the total area of the display, less than 30% of the total area of the display, less than 20% of the total area of the display, less than 10% of the total area of the display, etc. Reducing the overall area occupied by the opaque footprint may desirably increase the overall transparency of the display. However, reducing the area of the opaque footprint may require reducing the display resolution, may increase manufacturing costs, etc.

Figure 3:
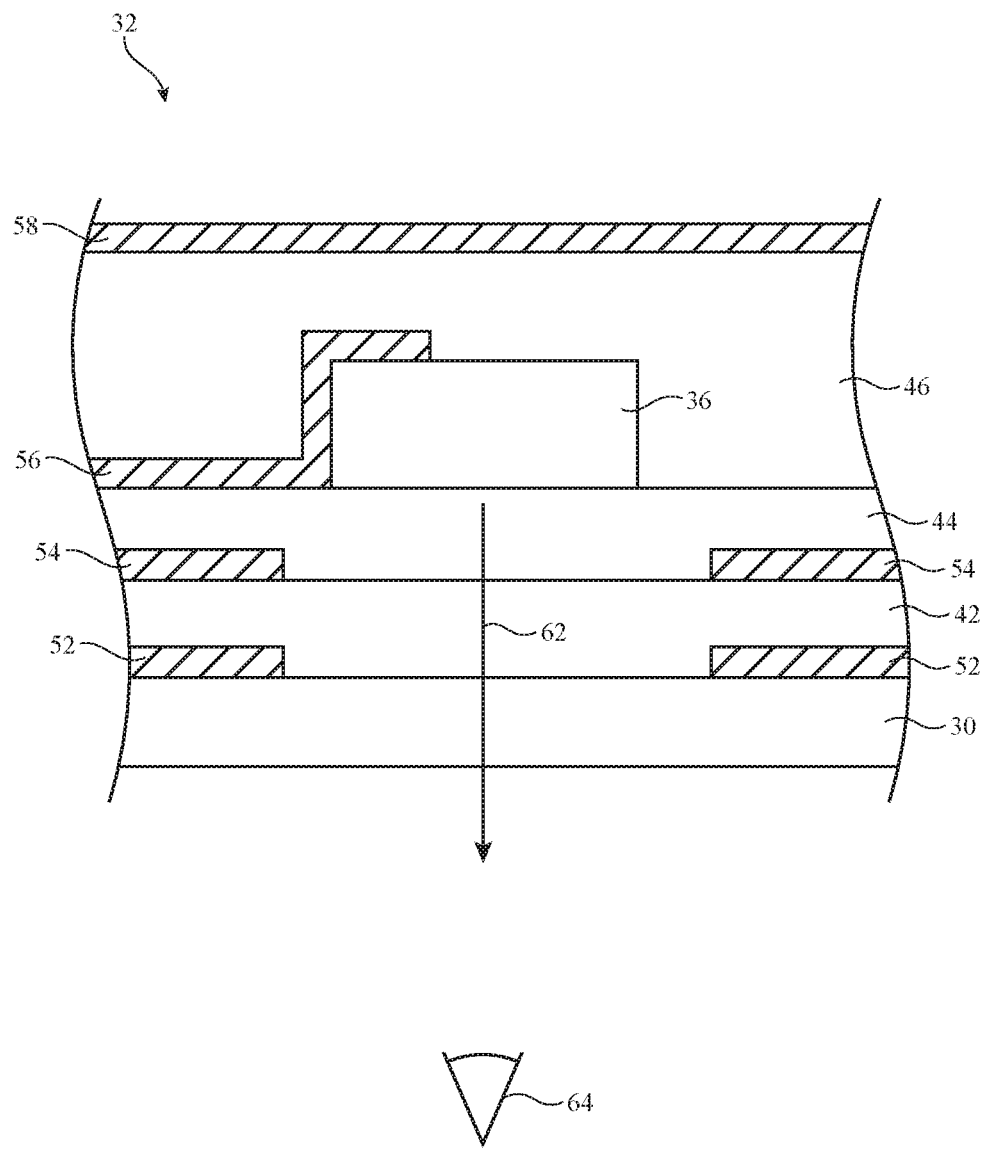
FIG. 3 is a cross-sectional side view of an illustrative light-emitting diode in a component mounting region of the display of FIG. 2 in accordance with an embodiment.

The opaque footprint of the display may be defined by one or more of the opaque layers or components within the display. FIG. 3 shows a cross-sectional side view of a component mounting region of the display that supports a light-emitting mounting diode. As shown in FIG. 3, the component mounting region includes a first dielectric layer 42 formed on transparent substrate 30, a second dielectric layer 44 formed on first dielectric layer 42, and a third dielectric layer 46 formed on second dielectric layer 44. Metal layers may also be incorporated amongst the dielectric layers. Metal layer 52 is formed on transparent substrate 30 between dielectric layer 42 and substrate 30. Metal layer 54 is formed on dielectric layer 42 between dielectric layer 42 and dielectric layer 44. Metal layer 56 is formed on dielectric layer 44 between dielectric layer 46 and dielectric layer 44. Metal layer 58 is formed on dielectric layer 46.

Metal layers 54 and 56 may serve as signal paths within the display. The metal layers 54 and 56 may be patterned to have various electrically isolated signal paths (e.g., coplanar, electrically isolated signal paths may be formed from the same metal layer in one example). The signal paths formed by metal layers 54 and 56 may pass ground signals, power supply signals, data signals, and/or control signals between components of the display.

As shown in FIG. 3, light-emitting diode 36 may be formed between dielectric layers 44 and 46. The light-emitting diode may be a bottom-emitting light-emitting diode that emits light in direction 62 towards a viewer 64. Metal layer 56 (e.g., a signal path) may be electrically connected to light-emitting diode 36.

Metal layer 58 may serve as a reflector to ensure light is only emitted in direction 62 towards the viewer. Although light-emitting diode 36 is a bottom-emitting light-emitting diode, some light from the light-emitting diode may still be emitted away from the viewer towards metal layer 58. Without the presence of metal layer 58, the display light may be visible to additional viewers on the opposing side of the display (instead of only the intended viewer at position 64). For privacy reasons, this may be undesirable. The presence of metal layer 58 may prevent light from light-emitting diode 36 from being viewable at undesired positions and therefore increase the privacy of the display. A metal layer may be used to increase privacy regardless of whether the light-emitting diode is a bottom-emitting light-emitting diode (as in FIG. 3) or a top-emitting light-emitting diode. In either scenario, the metal layer may overlap the light-emitting diode and the light-emitting diode emits light away from the metal layer. Metal layer 52 may also be used to form signal paths for the display or may be used to define the opaque footprint of the display. Because metal layers 52 and 58 may sometimes cover additional opaque components and define an opaque footprint for the display, metal layers 52 and 58 may sometimes be referred to as masking layers 52 and 58.

The example of light-emitting diode 36 being a bottom-emitting light-emitting diode that emits light in direction 62 through transparent substrate 30 is merely illustrative. If desired, light-emitting diode 36 may instead be a top-emitting light-emitting diode that emits light away from transparent substrate 30 towards a viewer. The top-emitting light-emitting diode may emit the light through additional transparent layers formed from transparent dielectric materials such as glass, plastic, etc.

The relative thicknesses depicted in FIG. 3 are merely illustrative. In practice, transparent substrate 30 may be thicker than the remaining layers of the display. Transparent substrate 30 may have a thickness of greater than 500 micron, greater than 1,000 micron, greater than 200 micron, less than 1,000 micron, between 500 micron and 1,000 micron, etc. The dielectric layers 42, 44, and 46 as well as metal layers 52, 54, 56, and 58 may have smaller thicknesses such as thicknesses less than 100 micron, less than 50 micron, less than 25 micron, less than 10 micron, less than 5 micron, greater than 1 micron, between 1 and 10 micron, etc.

One or more of the metal layers depicted in FIG. 3 may be omitted if desired. For example, metal layer 52 may be omitted or metal layer 58 may be omitted. Metal layers 52, 54, 56, and 58 may be formed from the same materials or from different materials. Metal layers 52, 54, 56, and 58 may be formed from copper, silver, or any other desired material.

In some cases, the opaque footprint of the display may be periodic. As shown in FIG. 2, the component mounting regions 32 have a regular, repeating shape and are arranged in a grid. Similarly, the signal paths 38 between component mounting regions are arranged in a repeating, grid-like pattern. These repetitive, opaque structures with small transparent gaps between them may create visible artifacts when viewing light through the display. Diffraction of environmental light that passes through the transparent display to the viewer results in undesirable visible artifacts such as rainbow effects and diffraction spikes.

Figure 4B:
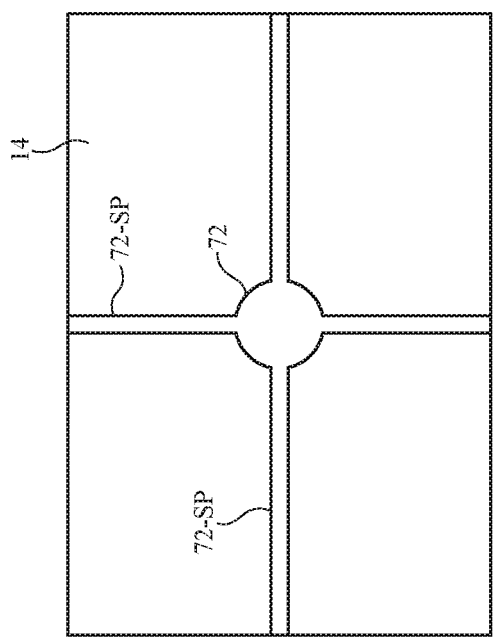
FIGS. 4A and 4B are top views of an illustrative transparent display showing the appearance of a point light source viewed through the display in accordance with an embodiment.
Figure 4A:
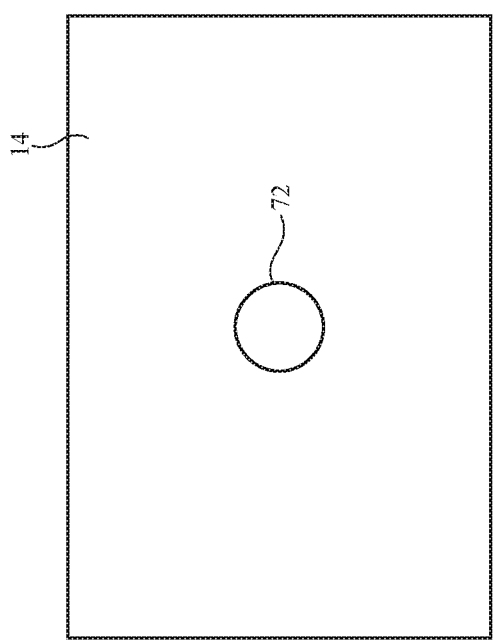

An example of these diffraction effects is shown in FIGS. 4A and 4B. In particular, consider the example of a point light source that is positioned behind transparent display 14. When a viewer views the point light source through the transparent display, the point light source should (ideally) appear as a circular area of light. FIG. 4A shows an example of this type, with the light from the point source appearing over area 72. In FIG. 4A (e.g., in an ideal scenario where no diffraction artifacts are present), area 72 has a circular shape without additional spikes or rainbow effects. In practice, the repeating structures of FIG. 2 may result in area 72 having an appearance as shown in FIG. 4B. As shown, area 72 in FIG. 4B includes spike portions 72-SP in addition to a circular portion.

These types of diffractive artifacts are undesirable. There are numerous ways to mitigate these types of diffraction artifacts while still including the requisite opaque components of the display. In general, to mitigate diffraction artifacts, the shapes of the opaque footprint of the display may be selected to include non-periodic portions (e.g., to include randomness and reduce periodicity).

Figure 5:
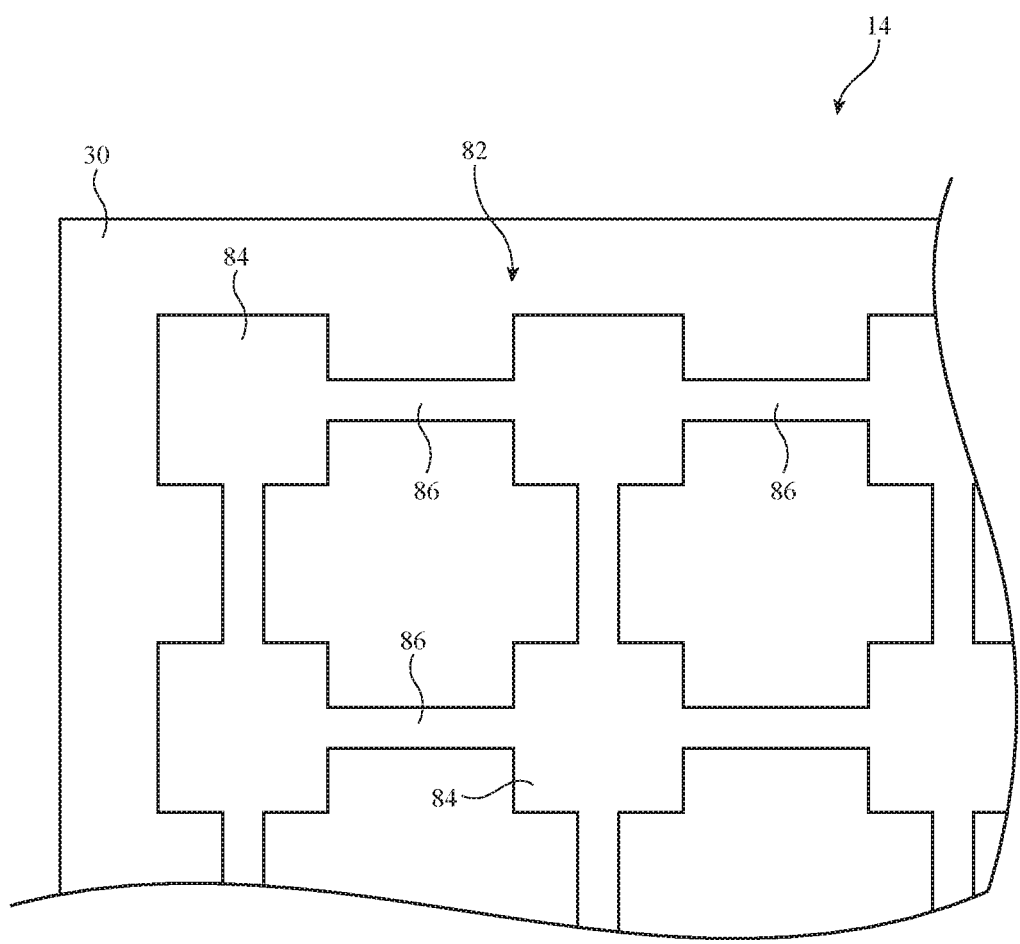
FIG. 5 is a top view of an illustrative opaque footprint of a display in accordance with an embodiment.

FIG. 5 is a top view of an illustrative display showing an opaque footprint of the display. As shown in FIG. 5, opaque footprint 82 includes both component mounting portions 84 and interconnect portions 86. The component mounting portions 84 may generally correspond to component mounting regions 32 (see FIG. 2) upon which driver ICs and LEDs are mounted. The interconnect portions 86 may generally correspond to signal paths 38 (see FIG. 2) that extend between adjacent component mounting regions.

Any desired component within the display may be used to define the opaque footprint. For example, metal layer 52 and/or metal layer 58 in FIG. 3 may be used to define the opaque footprint. In one example, metal layer 58 may be patterned to have a larger area than the other opaque components. Therefore, the dimensions of metal layer 58 (masking layer 58) set the dimensions of the opaque footprint. In another example, metal layer 52 may be patterned to have a larger area than the other opaque components. Therefore, the dimensions of metal layer 52 (masking layer 52) set the dimensions of the opaque footprint. In yet another example, metal layer 52 may define a portion of the opaque footprint and metal layer 58 may define an additional portion of the opaque footprint.

Metal layers 54 and 56 may also be used to define the opaque footprint if desired. However, having individual signal paths form part of the opaque footprint may sometimes result in undesirable diffractive artifacts. To avoid this, the interconnect portions of the opaque footprint may have a singular width instead of numerous portions with respective widths (as in FIG. 2). Forming the actual signal paths in this manner may undesirably increase the resistance of the signal paths. Therefore, metal layers 54 and 56 may be used to form signal paths of smaller widths (similar to as shown in FIG. 2). An additional metal layer such as masking layer 58 or masking layer 52 may then be used to cover the signal paths in the interconnect portions. Thus, the masking layer defines the opaque footprint into a desired shape while allowing the signal paths to maintain a smaller width and corresponding smaller resistances.

The example of metal layers being used to define the opaque footprint is merely illustrative. If desired, other types of materials may be used to form opaque structures that at least partially define the opaque footprint. For example, ink (e.g., including pigment or dye), carbon black, metal, and/or metal oxide materials may all be used to form some or all of the opaque footprint. These opaque materials may be patterned to form the opaque footprint using etching and/or grinding (e.g., a subtractive process). In addition or instead, one or more of the opaque materials may be added to the electronic device to form a desired opaque footprint (e.g., an additive process).

Both component mounting portions 84 and interconnect portions 86 may contribute to the diffraction artifacts (sometimes referred to as diffractive artifacts) in the display. Therefore, mitigation techniques for both portions will be discussed herein. First, we will examine diffraction artifact mitigation techniques for the component mounting portions 84.

Figure 6A:
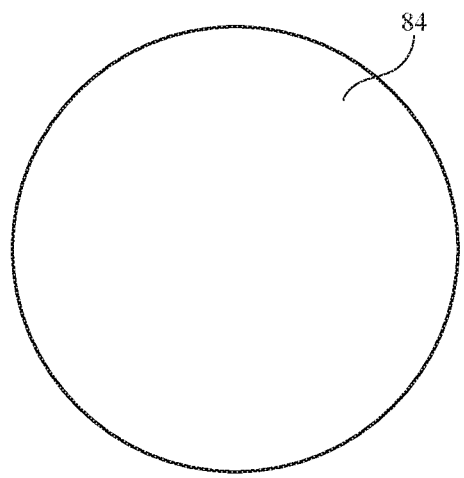
FIGS. 6A-6D are top views of various shapes that may be used for illustrative component mounting portions of an opaque footprint in accordance with an embodiment.

The example of FIG. 5 of having a grid of square component mounting portions 84 may result in diffractive artifacts such as those shown in FIG. 4B. Therefore, the component mounting portions may have a different shape as shown in FIGS. 6A-6D. FIG. 6A is a top view of an illustrative component mounting portion 84 with a circular shape. The opaque footprint may include a grid of component mounting portions 84 each having the circular shape of FIG. 6A.

Figure 6B:
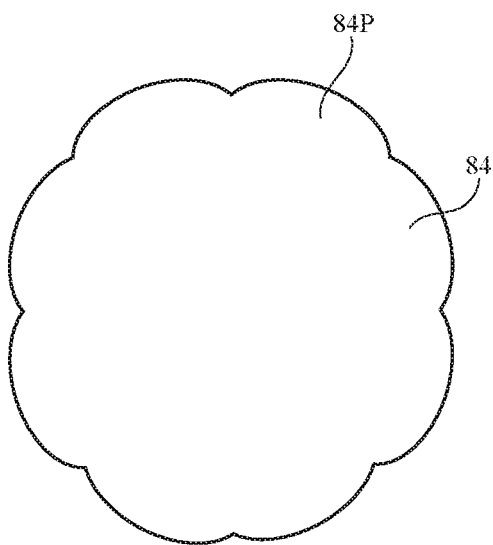

FIG. 6B is a top view of an illustrative component mounting portion 84 with eight curved protruding portions 84P. The curved protruding portions may be evenly distributed about the perimeter of the component mounting portion. Each curved protruding portion 84P may have a uniform shape and size or may have different shapes and sizes. The component mounting portion 84 of FIG. 6B is symmetric in both the vertical and horizontal direction. The opaque footprint may include a grid of component mounting portions 84 each having the shape of FIG. 6B.

Figure 6C:
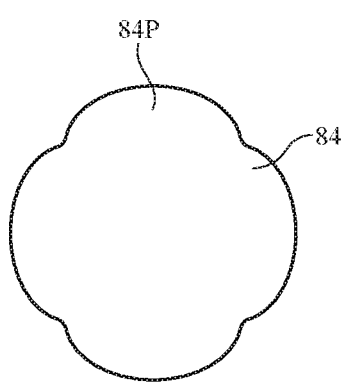

FIG. 6C is a top view of an illustrative component mounting portion 84 with four curved protruding portions 84P. The curved protruding portions may be evenly distributed about the perimeter of the component mounting portion. Each curved protruding portion 84P may have a uniform shape and size or may have different shapes and sizes. The component mounting portion 84 of FIG. 6C is symmetric in both the vertical and horizontal direction. In general the component mounting portion may have any desired number of curved protruding portions (e.g., more than two, more than four, more than eight, more than sixteen, etc.) that are uniformly or non-uniformly distributed about the perimeter. The opaque footprint may include a grid of component mounting portions 84 each having the shape of FIG. 6C.

Figure 6D:
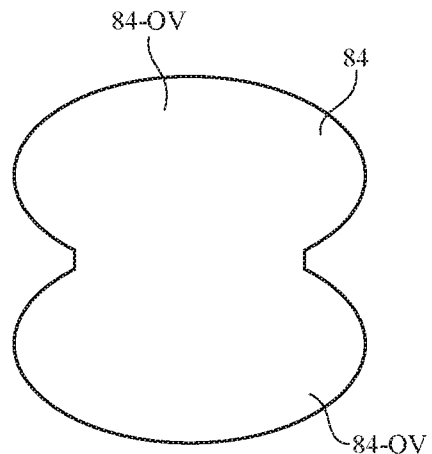

FIG. 6D is a top view of an illustrative component mounting portion 84 with two connected oval portions 84-OV. Each oval portion 84-OV may have a uniform shape and size or may have different shapes and sizes. The component mounting portion 84 of FIG. 6D is symmetric in both the vertical and horizontal direction. The opaque footprint may include a grid of component mounting portions 84 each having the shape of FIG. 6D.

A regular shape has sides of equal lengths and inside angles that are all the same. The component mounting portions 84 of the opaque footprint of the display may be regular shapes (as with FIGS. 5 and 6A). Alternatively, the component mounting portions 84 of the opaque footprint of the display may be irregular shapes (as with FIGS. 6B-6D).

Figure 7:
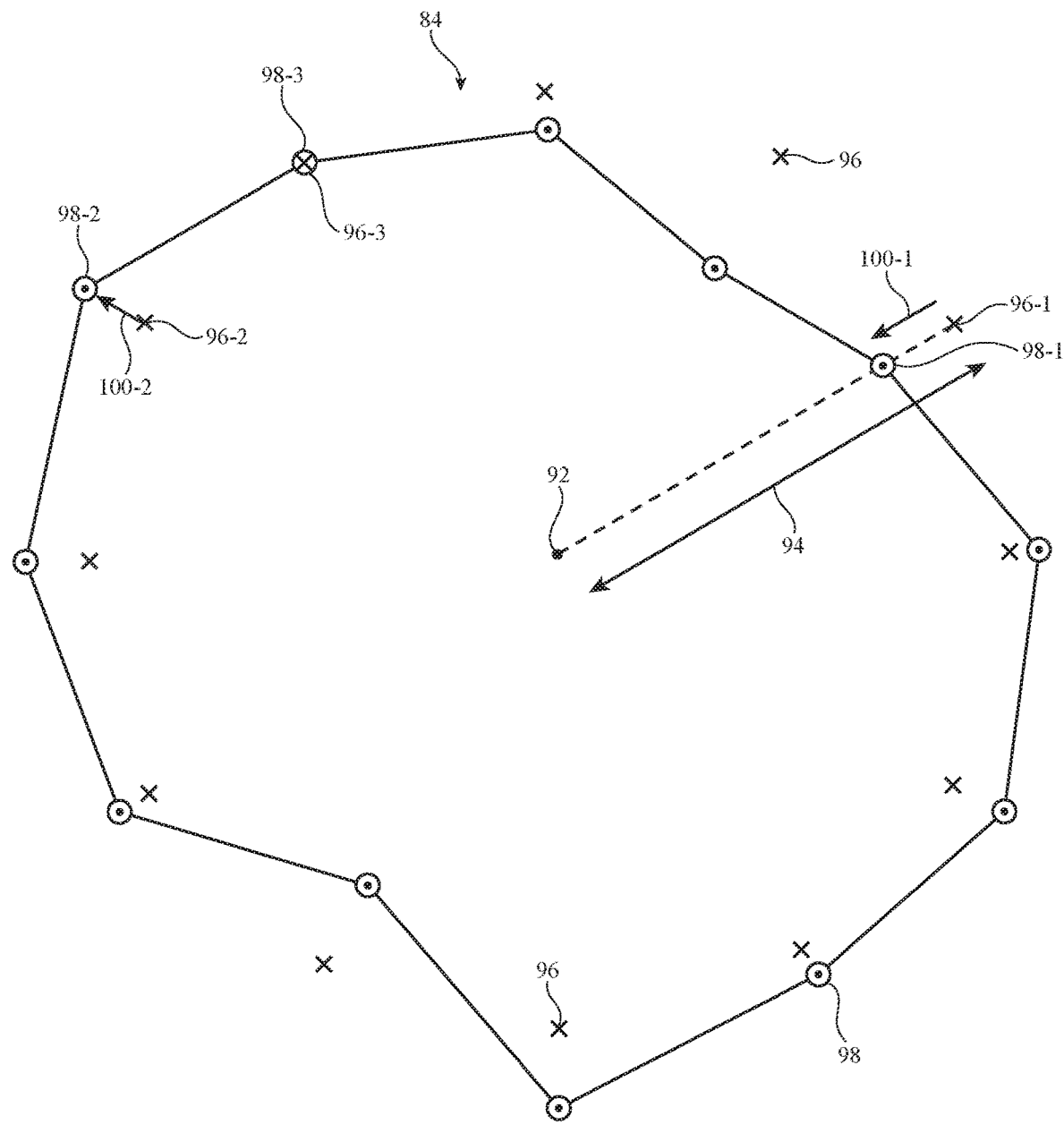
FIG. 7 is a top view of an illustrative component mounting portion that has a random shape in accordance with an embodiment.

The component mounting portions 84 of FIGS. 6A-6D may mitigate diffraction artifacts relative to arrangements with square component mounting portions. However, additional benefits may be obtained from using component mounting portions having random shapes. FIG. 7 is a top view of a component mounting portion 84 having a random shape. Introducing randomness into the shape of the component mounting region may break the periodicity of the opaque footprint and reduce diffraction artifacts.

To produce the component mounting portion 84 having a random shape, the perimeter of a reference circle may be adjusted in a random fashion. As shown in FIG. 7, the component mounting portion 84 has a center 92. A reference circle with center 92 has a radius 94. A number of reference points 96 (marked by an x in FIG. 7) on the perimeter of this reference circle may then be identified. In other words, each reference point 96 is at a distance 94 from the center 92. The reference points 96 may be evenly or unevenly distributed about the perimeter of the circle. In FIG. 7, the reference points 96 are depicted as being evenly distributed about the perimeter of the circle.

To generate the random shape, an additional point 98 (sometimes referred to as outline point 98 or anchor point 98) may be generated for each reference point 96. Each additional point 98 may be shifted from the corresponding reference point either directly towards or directly away from center 92 by a random amount. For example, point 98-1 has been shifted from point 96-1 towards center 92 by a distance 100-1. Point 98-2 has been shifted from point 96-1 away from center 92 by a distance 100-2.

A shift (e.g., distance 100) towards the center 92 may be defined as a negative shift whereas a shift away from the center 92 may be defined as a positive shift. The shift distance may be randomly selected from a predetermined range. The predetermined range may be defined in absolute terms (e.g., a distance in micron) or in relative terms (e.g., as a percentage of radius 94). The shift distance range may be ±1 micron, ±0.5 micron, ±2 micron, ±3 micron, ±5 micron, ±10 micron, ±20 micron, ±30 micron, ±50 micron, ±100 micron, ±500 micron, etc. The shift distance range may be ±10% of the radius, ±15% of the radius, ±5% of the radius, ±20% of the radius, ±25% of the radius, ±30% of the radius, etc.

In some cases, the shift distance may be randomly selected to be 0. In this case, the outline point 98 will be the same as reference point 96. An example of this type is shown in FIG. 7, with reference point 96-3 at the same point as outline point 98-3.

The perimeter of the randomly shaped component mounting portion 84 may pass through each randomly generated anchor point 98. The sides between each anchor point may be lines (as in FIG. 7) or may be curved if desired.

Any desired number of reference points (and corresponding randomly generated anchor points) may be used to form the randomly shaped component mounting portion 84. The component mounting portion may be formed using more than six reference points, more than ten reference points, more than twelve reference points, more than twenty reference points, more than thirty reference points, less than thirty reference points, less than twenty-five reference points, between fifteen and twenty-five reference points, etc. The example in FIG. 7 of the reference points being evenly distributed around the perimeter of the reference circle is merely illustrative. If desired, the reference points may be unevenly distributed (e.g., randomly distributed) about the perimeter of the reference circle for additional randomness. The randomly shaped component mounting portion 84 has a non-periodic shape and therefore sometimes may be referred to as a non-periodic component mounting portion.

The randomly shaped component mounting portion 84 may ultimately have a center and a plurality of vertices. Each vertex may be greater than a first distance from the center (e.g., greater than the radius of the reference circle minus the maximum shift distance) but less than a second distance from the center (e.g., less than the radius of the reference circle plus the maximum shift distance). In other words, each vertex may be within a given distance of a reference circle (e.g., the given distance may be 30% of the radius of the reference circle). At least four unique distances may be present between the center and the vertices, at least six unique distances may be present between the center and the vertices, at least ten unique distances may be present between the center and the vertices, at least twelve unique distances may be present between the center and the vertices, at least fifteen unique distances may be present between the center and the vertices, at least twenty unique distances may be present between the center and the vertices, less than thirty unique distances may be present between the center and the vertices, etc.

Figure 8:
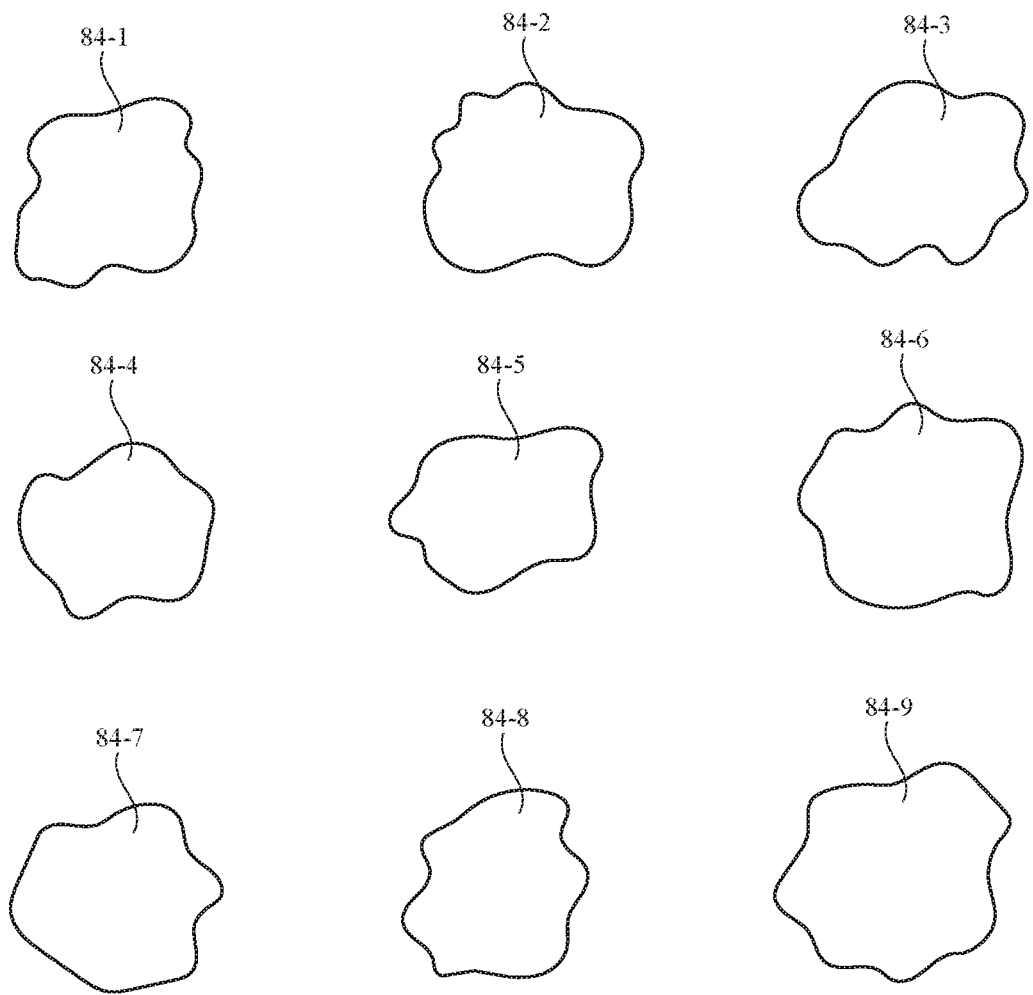
FIG. 8 is a top view of an illustrative plurality of component mounting portions having unique random shapes in accordance with an embodiment.

If the same random shape is used for every component mounting portion in the opaque footprint, some diffractive artifacts may still be present. To further reduce periodicity within the opaque footprint, multiple different random shapes may be used for the component mounting portions. FIG. 8 shows an example where multiple unique random shapes are used for the component mounting portions. In particular, nine component mounting portions 84 are arranged in a 3×3 grid, with portions 84-1, 84-2, and 84-3 formed in a first row, portions 84-4, 84-5, and 84-6 formed in a second row, and portions 84-7, 84-8, and 84-9 formed in a third row.

Each of the nine component mounting portions in FIG. 8 has a unique random shape that is formed using the technique shown in FIG. 7. This 3×3 grid of component mounting portions (e.g., a unit cell) may then be repeated across the display. The grid size of unique random shapes that is repeated across the display may be any desired size (the 3×3 example of FIG. 8 is merely illustrative). In general, increasing the number of unique random shapes that is included in the repeated unit cell will reduce diffraction artifacts. However, increasing the number of unique random shapes that is included in the grid may also increase manufacturing complexity. Therefore, these factors may be prioritized and the grid size may be selected based on the particular display design. The unit cell of random shapes that is repeated across the display may have 9 unique shapes (as in FIG. 8), 4 unique shapes (e.g., a 2×2 grid), 25 unique shapes (e.g., a 5×5 grid), 100 unique shapes (e.g., a 10×10 grid), more than 10 unique shapes, between 10 and 150 unique shapes, more than 50 unique shapes, more than 100 unique shapes, less than 200 unique shapes, between 50 and 150 unique shapes, etc.

Another technique that may be used to mitigate visible artifacts caused by diffraction is apodization. Apodization may refer to smoothly transitioning the opacity between the opaque portion and the transparent portion of the display. In the examples of FIGS. 6A-6D and FIG. 7, each component mounting portion 84 has a given shape. The entire given shape is opaque and the surrounding area is transparent. There is therefore a sharp step in transparency between the opaque portion and the transparent portion. Apodization (sometimes referred to herein as transparency tapering or transparency smoothing) may be used to smooth out the transition between opaque and transparent portions.

Figure 9:
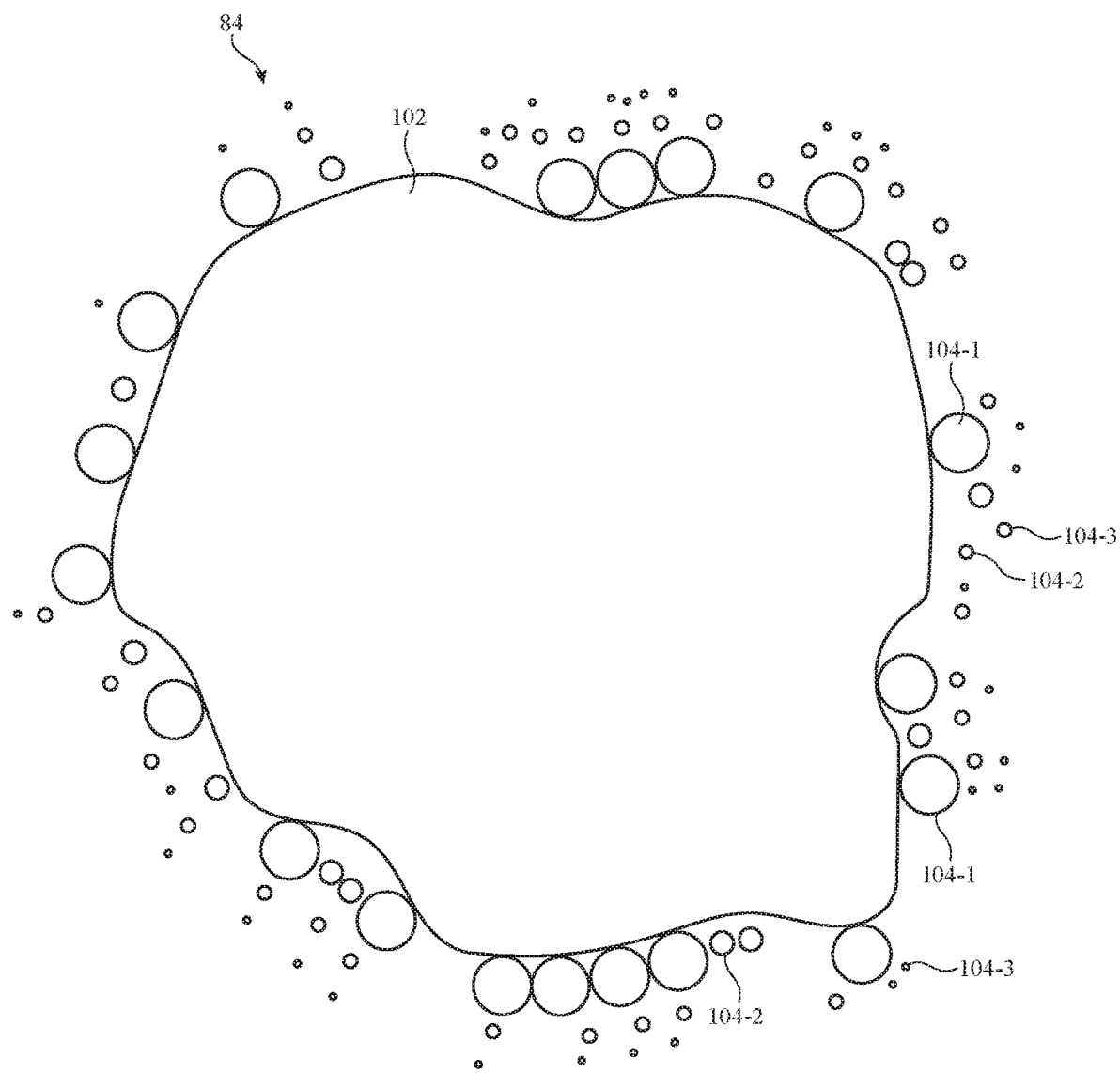
FIG. 9 is a top view of an illustrative component mounting region with apodization in accordance with an embodiment.

FIG. 9 is a top view of a component mounting portion 84 with apodization. As shown in FIG. 9, there may be a base shape 102. In FIG. 9, the base shape is a random shape of the type shown in FIG. 7. However, the base shape may instead be any of the shapes shown in FIGS. 6A-6D if desired. In addition to the base shape, the component mounting portion 84 of the opaque footprint includes smoothing portions 104 (sometimes referred to as opaque patches). The smoothing portions may be circles (or any other desired shape) of opaque material with different sizes that surround the perimeter of the base shape. The smoothing portions may be different sizes. For example, in FIG. 9, there are smoothing portions 104-1, smoothing portions 104-2 that are smaller than portions 104-1, and smoothing portions 104-3 that are smaller than portions 104-2. In FIG. 9, transparency smoothing is approximated using opaque patches with varying size and spacing. In other words, each opaque patch 104 in FIG. 9 may have the same opacity as the base shape 102 (e.g., a transmission of less than 40% of incident light, less than 30% of incident light, less than 20% of incident light, less than 10% of incident light, less than 5% of incident light, less than 1% of incident light, etc.). This type of transparency smoothing may be referred to as halftone transparency smoothing. The transparency smoothing may be non-uniform around the base shape to increase non-periodicity.

The example in FIG. 9 of achieving transparency smoothing using opaque patches of decreasing sizes (e.g., halftone transparency smoothing) is merely illustrative. Alternatively, a material may be selected to define the opaque footprint with an opacity gradient. The opaque footprint may have a first transparency at a first point, a second transparency that is greater than the first transparency at a second point that is closer to the edge than the first point, a third transparency that is greater than the second transparency at a third point that is closer to the edge than the second point, etc. The opaque layer that defines the opaque footprint in component mounting portion 84 may be formed from two or more materials and may gradually adjust the transparency at the edge of the opaque footprint. Alternatively or in addition, a thickness gradient may be used at the edge of the opaque footprint to form a transparency gradient (e.g., the metal layer that defines the opaque footprint may become gradually thinner at the edge of the opaque footprint such that the transparency of the metal layer increases towards the edge of the opaque footprint). Component mounting portions having transparency smoothing at the edges (either through halftone transparency smoothing as in FIG. 9 or through another technique) may be referred to as non-periodic component mounting portions due to the non-uniform transparency gradient around the perimeter of the component mounting portion.

Using the shapes and techniques of any of FIGS. 6-9 may mitigate visible artifacts caused by the component mounting portions of the opaque footprint. However, even when these techniques are used, visible artifacts may be caused by the interconnect portions of the opaque footprint.

Figure 10A:
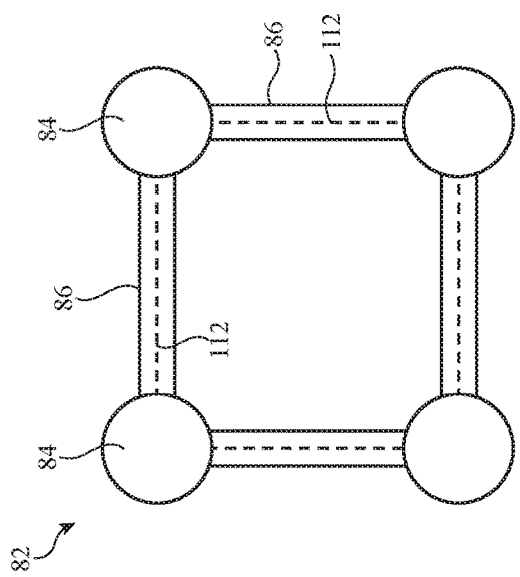
FIG. 10A is a top view of illustrative interconnect portions for an opaque footprint that are aligned with straight grid lines in accordance with an embodiment.

FIG. 10A is a top view of an opaque footprint for a display having periodic opaque interconnect portions. As shown in FIG. 10A, the opaque footprint 82 includes interconnect portions 86 between each component mounting portion 84. Each interconnect portion 86 may extend along a respective axis 112 (running along the center of the interconnect portion) between two component mounting portions 84. In FIG. 10A, each axis 112 is aligned with straight, uniform grid lines that extend from the center of one component mounting portion to the center of an adjacent component mounting portion. In other words, each axis 112 is a straight line and the spacing between each axis 112 is uniform across the opaque footprint. This type of periodicity in the interconnect portions may result in visible artifacts caused by diffraction. To mitigate the visible artifacts, randomness may be introduced to the interconnect portions.

Figure 10B:
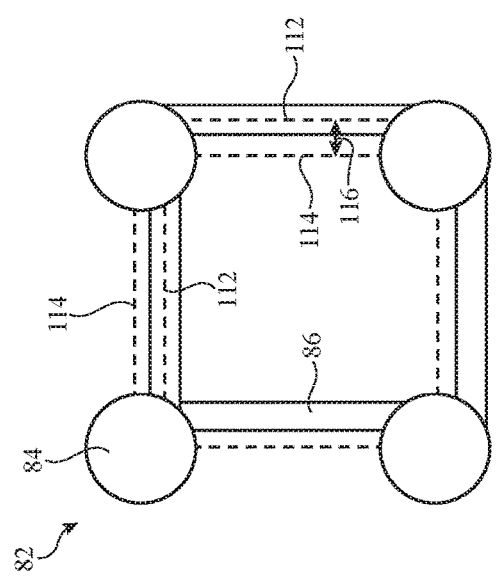
FIG. 10B is a top view of illustrative interconnect portions for an opaque footprint that are randomly shifted relative to straight grid lines in accordance with an embodiment.

FIG. 10B is a top view of an opaque footprint for a display having randomly shifted straight interconnect portions. As shown in FIG. 10B, each interconnect portion 86 may extend along a respective axis 112 (running along the center of the interconnect portion) between two component mounting portions 84. Each axis 112 in FIG. 10B is a straight line. However, the axes 112 are shifted relative to uniform grid lines 114 that extend from the center of one component mounting portion to the center of an adjacent component mounting portion. As shown, each axis may be shifted by a distance 116 relative to the grid lines 114. The direction and amount of the shift for each axis may be randomly selected from a predetermined range. The shift distance range may be ±0.1 micron, ±1 micron, ±0.5 micron, ±2 micron, ±3 micron, ±5 micron, ±10 micron, ±20 micron, ±30 micron, ±50 micron, etc. The shift distance range may be ±10% of the maximum dimension of the component mounting portion 84, ±15% of the maximum dimension of the component mounting portion 84, ±5% of the maximum dimension of the component mounting portion 84, ±20% of the maximum dimension of the component mounting portion 84, ±30% of the maximum dimension of the component mounting portion 84, ±50% of the maximum dimension of the component mounting portion 84, etc.

Figure 11:
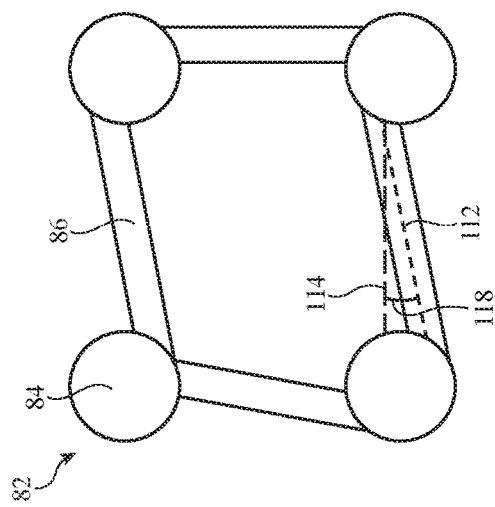
FIG. 11 is a top view of illustrative interconnect portions for an opaque footprint that are randomly tilted relative to straight grid lines in accordance with an embodiment.

In addition to or instead of a lateral shift in the interconnect portions, the angle of the interconnect portions may be randomized. An example of this type is shown in FIG. 11. FIG. 11 is a top view of an opaque footprint for a display having randomly angled straight interconnect portions. As shown in FIG. 11, each interconnect portion 86 may extend along a respective axis 112 (running along the center of the interconnect portion) between two component mounting portions 84. Each axis 112 in FIG. 11 is a straight line. However, the axes 112 are angled relative to uniform grid lines 114 that extend from the center of one component mounting portion to the center of an adjacent component mounting portion. As shown, each axis may be tilted by an angle 118 relative to the grid lines 114. The direction and amount of the tilt for each axis may be randomly selected from a predetermined range. The angular range of the tilt may be ±5°, ±100, ±15, ±200, ±300, etc.

Figure 12:
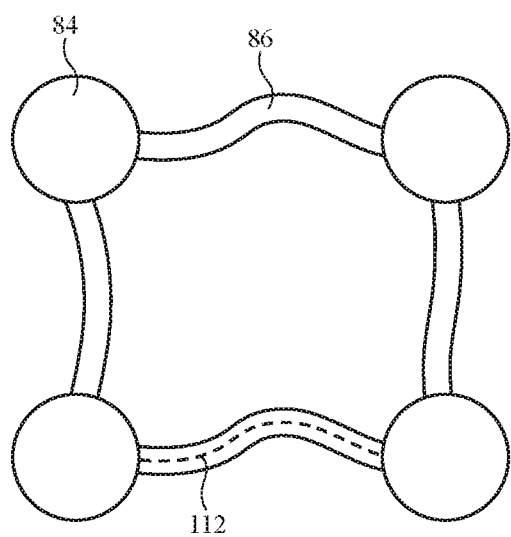
FIG. 12 is a top view of illustrative wavy interconnect portions for an opaque footprint in accordance with an embodiment.

FIG. 12 is a top view of an opaque footprint for a display having wavy interconnect portions. As shown in FIG. 12, each interconnect portion 86 may extend along a respective axis 112 (running along the center of the interconnect portion) between two component mounting portions 84. Each axis 112 in FIG. 12 has one or more curved portions and therefore may be described as wavy. The axis may have one or more planar portions in addition to the one or more curved portions if desired. In yet another embodiment, the axis 112 may have a number of linear segments that approximate a wavy axis with curvature. The shape of each wavy axis may be different. A random shape may be selected for each axis in one embodiment.

Figure 13:
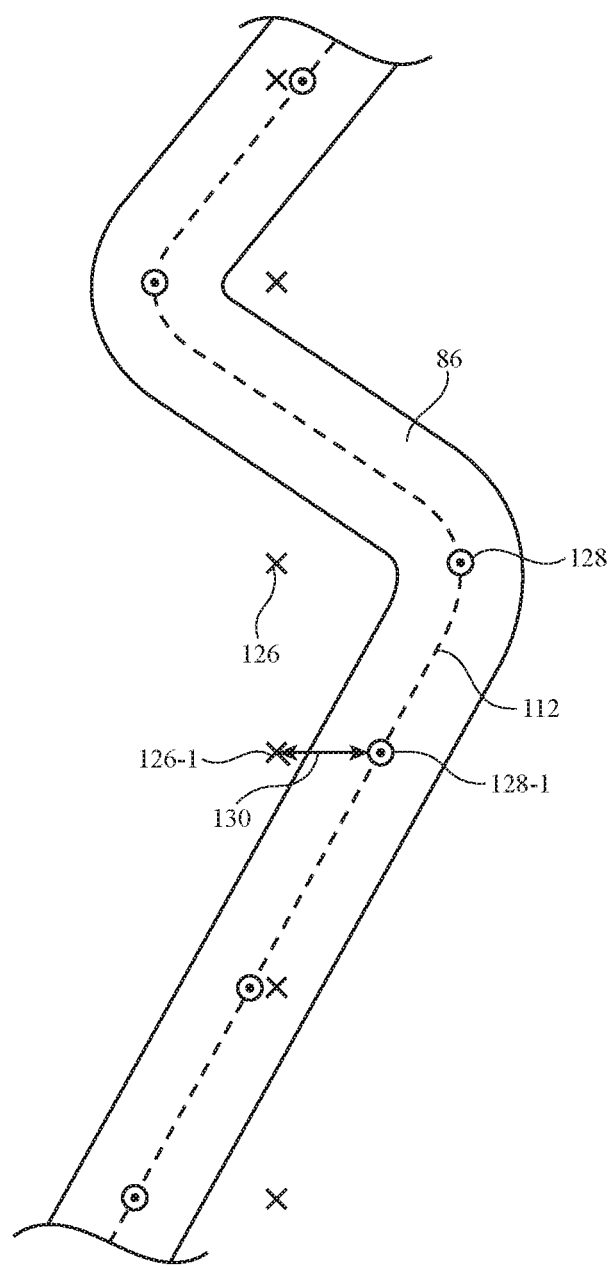
FIG. 13 is a top view of an illustrative interconnect portion that follows a random path in accordance with an embodiment.

FIG. 13 is a top view of an interconnect portion 86 having a random shape (e.g., following a random path). Introducing randomness into the shape of the interconnect portion may break the periodicity of the opaque footprint and reduce diffractive artifacts.

To produce the interconnect portion 86 having a random shape, a reference line may be adjusted in a random fashion. As shown in FIG. 13, a reference line may have a number of reference points 126 (marked by an x in FIG. 13). Each reference point 126 is at a different point along the reference line. The reference points 126 may be evenly or unevenly distributed along the reference line. In FIG. 13, the reference points 126 are depicted as being evenly distributed along the reference line.

To generate the random shape, an additional point 128 (sometimes referred to as axis point 128 or anchor point 128) may be generated that is associated with each reference point 126. Each additional point 128 may be shifted relative to reference point 126 in a direction orthogonal to the reference line by a random amount. For example, point 128-1 has been shifted away from point 126-1 by a distance 130.

The shift distance 130 for each axis point 128 may be randomly selected from a predetermined range. The predetermined range may be defined in absolute terms (e.g., a distance in micron) or in relative terms (e.g., a percentage of the length of the interconnect portion in the event the interconnect portion is a straight line between two adjacent component mounting portions). The shift distance range may be ±0.1 micron, ±1 micron, ±0.5 micron, ±2 micron, ±3 micron, ±5 micron, ±10 micron, ±20 micron, ±30 micron, ±50 micron, etc. The shift distance range may be ±10% of the length, ±15% of the length, ±5% of the length, ±20% of the length, ±25% of the length, ±30% of the length, ±50% of the length, etc.

In some cases, the shift distance may be randomly selected to be 0. In this case, the axis point 128 will be the same as reference point 126. The axis 112 of the randomly shaped interconnect portion 86 may pass through each randomly generated axis point 128. The axis may be straight or curved between each axis point. The interconnect portion therefore follows a random axis (path).

Any desired number of reference points (and corresponding randomly generated anchor points) may be used to form the randomly shaped interconnect portion 86. The interconnect portion may be formed using more than three reference points, more than six reference points, more than ten reference points, more than twenty reference points, more than thirty reference points, less than thirty reference points, less than twenty-five reference points, between fifteen and twenty-five reference points, between three and then reference points, etc. The example in FIG. 13 of the reference points being evenly distributed along the reference line is merely illustrative. If desired, the reference points may be unevenly distributed (e.g., randomly distributed) along the reference line for additional randomness.

Figure 14A:
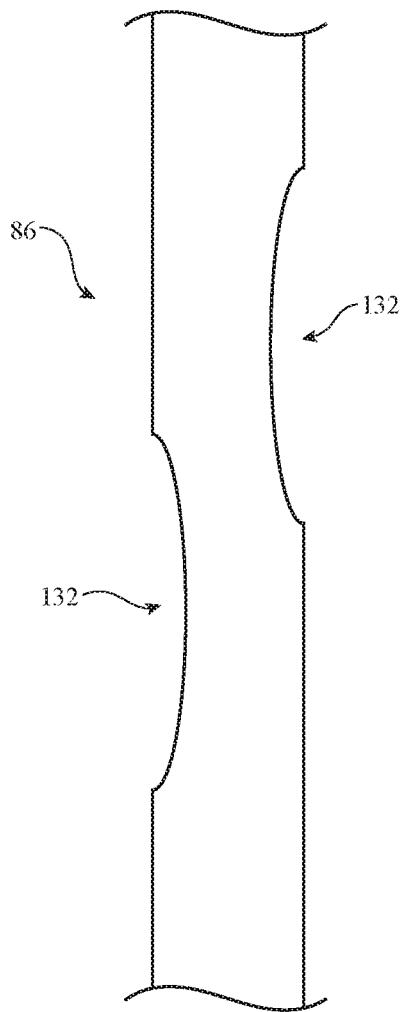
FIGS. 14A and 14B are top views of illustrative interconnect portions having edge recesses in accordance with an embodiment.
Figure 14B:
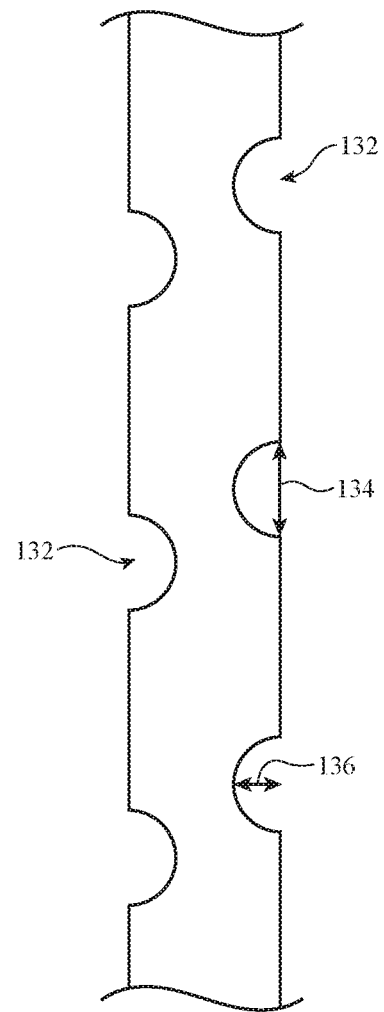

FIGS. 14A and 14B show additional arrangements for interconnect portion 86 that disrupt periodicity across the opaque footprint. In FIGS. 14A and 14B, recesses 132 are formed along the edges of the interconnect portion and may therefore sometimes be referred to as edge recesses 132. Recesses 132 may have any desired shape. In FIG. 14A, the recesses are defined by arcs. In FIG. 14B, the recesses are defined by semicircles. The recesses may be distributed periodically (evenly) along the length of the interconnect portion or may be distributed non-periodically (unevenly) along the length of the interconnect portion. The recesses may have a width 134 and a depth 136. Width 134 may be more than 0.1 micron, more than 1 micron, more than 0.5 micron, more than 2 micron, more than 3 micron, more than 5 micron, more than 10 micron, more than 20 micron, more than 30 micron, more than 50 micron, less than 50 micron, between 0.1 micron and 10 micron, etc. Depth 136 may be more than 0.1 micron, more than 1 micron, more than 0.5 micron, more than 2 micron, more than 3 micron, more than 5 micron, more than 10 micron, more than 20 micron, more than 30 micron, more than 50 micron, less than 50 micron, between 0.1 micron and 10 micron, etc.

Figure 15:
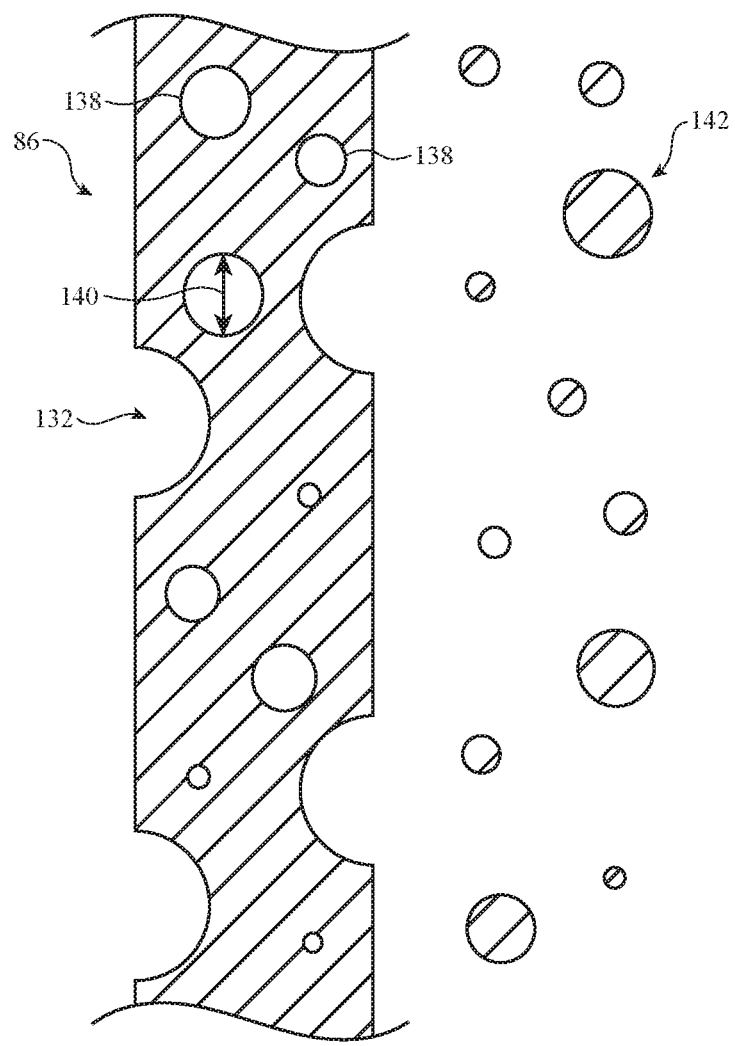
FIG. 15 is a top view of illustrative interconnect portion having holes and opaque patches in accordance with an embodiment.

In addition to or instead of recesses 132 in the edges of the interconnect portion, interconnect portion 86 may include openings such as openings 138 in FIG. 15. Openings 138 (sometimes referred to as holes 138, recesses 138, etc.) may be formed in the main portion of interconnect portion 86 (e.g., such that the openings are completely laterally surrounded by the opaque portions of interconnect portion 86). Openings 138 may have different shapes and sizes if desired. Each opening 138 may have a diameter (or, if the opening is not circular, a largest lateral dimension) 140. Diameter 140 may be more than 0.1 micron, less than 0.1 micron, more than 1 micron, more than 0.5 micron, more than 2 micron, more than 3 micron, more than 5 micron, more than 10 micron, more than 20 micron, more than 30 micron, more than 50 micron, less than 50 micron, between 0.1 micron and 10 micron, etc.

In addition to openings 138, additional opaque patches (sometimes referred to as opaque islands) may be included in interconnect portion 86. Opaque patches 142 are electrically isolated (e.g., not electrically connected to the main portion of interconnect portion 86) and therefore cannot be used to convey signals. However, the added opaque patches may increase the randomness of the interconnect portion and help mitigate visible artifacts. Similar to openings 138, each opaque patch 142 may have a diameter that is more than 0.1 micron, less than 0.1 micron, more than 1 micron, more than 0.5 micron, more than 2 micron, more than 3 micron, more than 5 micron, more than 10 micron, more than 20 micron, more than 30 micron, more than 50 micron, less than 50 micron, between 0.1 micron and 10 micron, etc. The opaque patches may have different sizes and may be randomly distributed in a region adjacent to the main portion of interconnect portion 86.

As previously mentioned, opaque interconnect portion 86 may be defined either by masking layers that overlap signal paths or by the signal paths themselves. The opaque interconnect portions 86 depicted in FIGS. 10A, 10B, 11, 12, 13, 14A, 14B, and 15 may therefore be defined by masking layers (e.g., metal layers 52 and/or 58 in FIG. 3) that overlap signal paths (e.g., signal paths formed by metal layers 54 and/or 56 in FIG. 3). Alternatively, the signal paths themselves may have the opaque footprints shown in FIGS. 10A, 10B, 11, 12, 13, 14A, 14B, and 15. When multiple signal paths are coupled between component mounting portions of the opaque footprint, each signal path may have a unique shape (e.g., any of the shapes shown in FIGS. 10-15) or may have the same shape.

FIG. 16A is a top view of an illustrative interconnect portion that is formed by circular rings to mitigate diffraction artifacts. As shown, the interconnect portion 86 has a number of rings 152. The ring shape is repeated along the length of the interconnect portion, with each ring being electrically connected to the adjacent rings. Each ring may be defined by an opening (e.g., a circular opening, oval opening, or opening of another shape) having a diameter (or largest lateral dimension in the event that the rings are not circular) 154. Diameter 154 may be more than 0.1 micron, less than 0.1 micron, more than 1 micron, more than 0.5 micron, more than 2 micron, more than 3 micron, more than 5 micron, more than 10 micron, more than 20 micron, more than 30 micron, more than 50 micron, less than 50 micron, between 0.1 micron and 10 micron, etc.

In FIG. 16A, opaque interconnect portions 86 may be defined by masking layers (e.g., metal layers 52 and/or 58 in FIG. 3) that overlap signal paths (e.g., signal paths formed by metal layers 54 and/or 56 in FIG. 3). Alternatively, the signal paths themselves may have the opaque footprint shown in FIG. 16A.

As shown in FIG. 16B, signal paths 38-1 and 38-2 define interconnect portion 86 of the opaque footprint. Each of signal paths 38-1 and 38-2 has a similar shape to the repeated ring shape shown in FIG. 16A. Signal path 38-1 has a number of rings 152-1. The ring shape is repeated along the length of the interconnect portion, with each ring being electrically connected to the adjacent rings. Signal path 38-2 has a number of rings 152-2. The ring shape is repeated along the length of the interconnect portion, with each ring being electrically connected to the adjacent rings. In FIG. 16B, signal path 38-1 has rings defined by diameter 154-1 whereas signal path 38-2 has rings defined by diameter 154-2. As shown, the diameters may be different to reduce periodicity. Diameter 154-1 may be greater than 154-2 (as in FIG. 16B) or smaller than diameter 154-2.

In FIGS. 16A and 16B, examples are shown where each signal path (or masking layer that covers signal paths and defines an opaque footprint) has a shape or repeating rings of uniform size. However, the repeating rings may have different sizes along the length of the interconnect portion. FIG. 16C is a top view of an interconnect portion of this type. As shown, the interconnect portion 86 has a number of rings 152. The ring shape is repeated along the length of the interconnect portion, with each ring being electrically connected to the adjacent rings. Each ring may be defined by an opening having a diameter 154. However, the diameter varies along the length of the interconnect portion. For example, ring 152-1 has a diameter 154-1, ring 152-2 has a diameter 154-2, and ring 152-3 has a diameter 154-3. Diameters 154-1 and 154-3 are the same, but diameter 154-2 is different (smaller) than diameters 154-1 and 154-3. The diameter of each ring may be selected randomly, may be varied in a predetermined pattern along the length of the interconnect portion, etc.

In FIG. 16C, opaque interconnect portions 86 may be defined by masking layers (e.g., metal layers 52 and/or 58 in FIG. 3) that overlap signal paths (e.g., signal paths formed by metal layers 54 and/or 56 in FIG. 3). Alternatively, the signal paths themselves may have the opaque footprint shown in FIG. 16C.

Figure 17C:
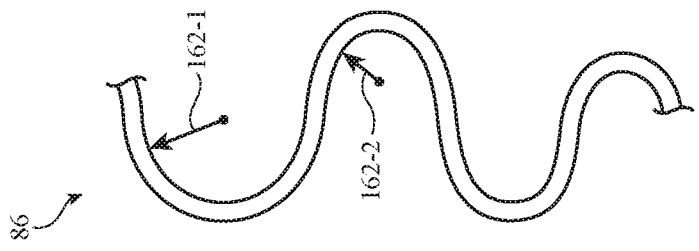
FIG. 17C is a top view of an illustrative interconnect portion with a curved structure having different size curves in accordance with an embodiment.
Figure 17B:
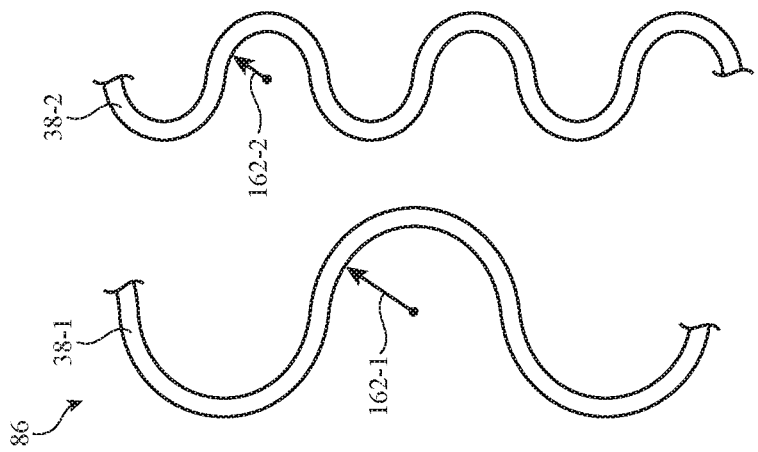
FIG. 17B is a top view of an illustrative interconnect portion showing how adjacent signal paths may have curved structures having different sizes in accordance with an embodiment.
Figure 17A:
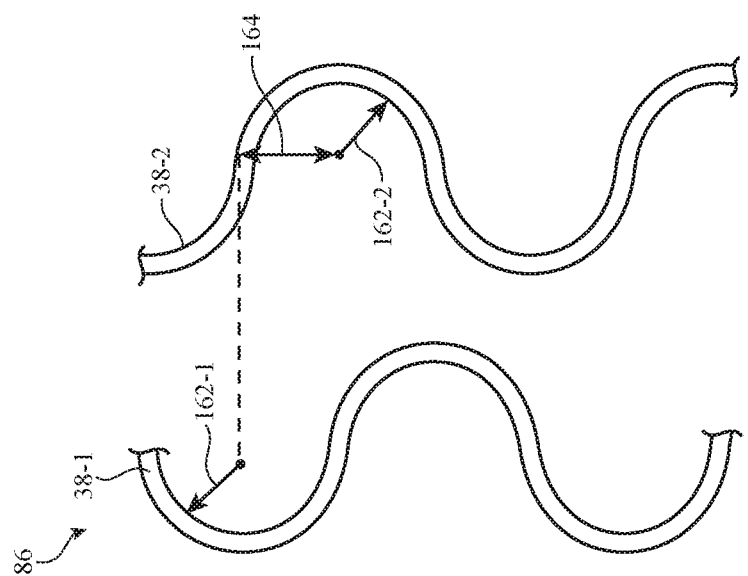
FIG. 17A is a top view of an illustrative interconnect portion showing how adjacent signal paths may have curved structures that are shifted relative to one another in accordance with an embodiment.

In FIG. 17A, signal paths 38-1 and 38-2 define interconnect portion 86 of the opaque footprint. Each of signal paths 38-1 and 38-2 is formed with a plurality of curves. Signal paths 38-1 and 38-2 may be described as serpentine, S-shaped, sinusoidal, etc. Each curve of the signal path has an associated radius of curvature. For example, each curve of signal path 38-1 has a radius of curvature 162-1. In FIG. 17A, the radius of curvature for each curve along the length of the signal path 38-1 is the same. Adjacent signal path 38-2 also has a radius of curvature 162-2. The radius of curvature for each curve along the length of the signal path 38-2 is the same. Radius of curvature 162-1 and radius of curvature 162-2 may each be more than 0.1 micron, less than 0.1 micron, more than 1 micron, more than 0.5 micron, more than 2 micron, more than 3 micron, more than 5 micron, more than 10 micron, more than 20 micron, more than 30 micron, more than 50 micron, less than 50 micron, between 0.1 micron and 10 micron, etc.

In FIG. 17A, radius curvature 162-1 for signal path 38-1 is the same as radius of curvature 162-2 for signal path 38-2. However, the signal paths may be shifted relative to one another to mitigate diffraction artifacts. As shown, signal path 38-2 is shifted by distance 164 relative to signal path 38-1. Therefore, even though the signal paths have the same shape and same repeated radius of curvature along the length of the signal path, periodicity may be reduced. Distance 164 may be more than 0.1 micron, less than 0.1 micron, more than 1 micron, more than 0.5 micron, more than 2 micron, more than 3 micron, more than 5 micron, more than 10 micron, more than 20 micron, more than 30 micron, more than 50 micron, less than 50 micron, between 0.1 micron and 10 micron, etc.

In some cases, adjacent signal paths may have different radii of curvature, as shown in FIG. 17B. As shown, signal path 38-1 has an associated radius of curvature 162-1 that remains constant along the length of signal path 38-1. Signal path 38-2 has an associated radius of curvature 162-2 that remains constant along the length of signal path 38-2. However, radius of curvature 162-1 is different than radius of curvature 162-2. This may reduce diffractive artifacts in the display.

In some cases, the interconnect portion may have varying radii of curvature along its length. As shown in FIG. 17C, interconnect portion 86 may have a plurality of curves and may be described as serpentine, S-shaped, sinusoidal, etc. However, different curves may have different radii of curvature. A first curve may have a first radius of curvature 162-1. A second curve may have a second radius of curvature 162-2 that is different than the first radius of curvature. The different radii of curvature may alternate in a predetermined pattern. Alternatively, the radius of curvature for each curve may be randomly selected.

In FIG. 17C, opaque interconnect portions 86 may be defined by masking layers (e.g., metal layers 52 and/or 58 in FIG. 3) that overlap signal paths (e.g., signal paths formed by metal layers 54 and/or 56 in FIG. 3). Alternatively, the signal paths themselves may have the opaque footprint shown in FIG. 17C.

Figure 17D:
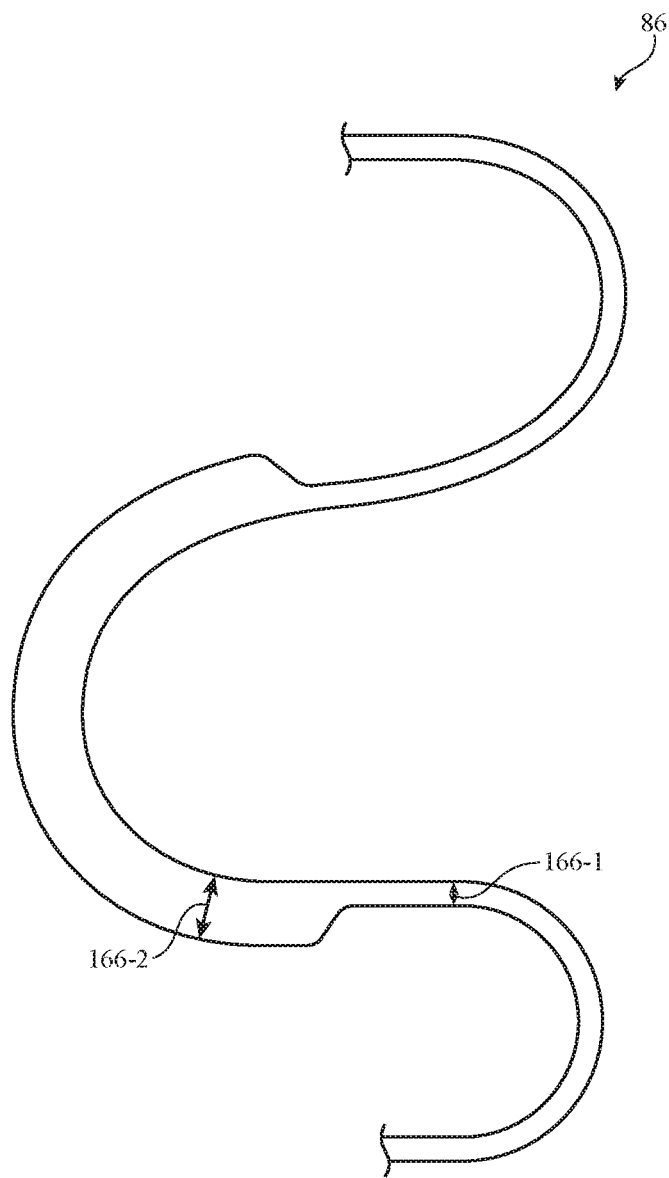
FIG. 17D is a top view of an illustrative interconnect portion with a curved structure having different widths in accordance with an embodiment.

In yet another example, shown in FIG. 17D, the interconnect portion may have a varying width along its length. As shown in FIG. 17D, interconnect portion 86 may have a plurality of curves and may be described as serpentine, S-shaped, sinusoidal, etc. However, different curves in the interconnect portion may have different widths. A first curve may have a first width 166-1. A second curve may have a second width 166-2 that is different from the first width. The different widths may alternate in a predetermined pattern. Alternatively, the width for each curve of the interconnect portion (or at any given point along the interconnect portion) may be randomly selected.

In FIG. 17D, opaque interconnect portions 86 may be defined by masking layers (e.g., metal layers 52 and/or 58 in FIG. 3) that overlap signal paths (e.g., signal paths formed by metal layers 54 and/or 56 in FIG. 3). Alternatively, the signal paths themselves may have the opaque footprint shown in FIG. 17D.

In general, any property of the interconnect portion (e.g., width, shape, thickness, radius of curvature, ring pitch, curve pitch, recess patterning, etc.) may vary or be randomized to increase non-periodicity. The width (or any other desired property) of the interconnect portion may vary, regardless of the shape of the interconnect portion. In other words, interconnect portions having randomized wavy paths (as in FIG. 13), interconnect portions having recesses (as in FIGS. 14 and 15), interconnect portions having repeated ring shapes (as in FIG. 16), interconnect portions having serpentine shapes (as in FIG. 17), straight interconnect portions (as in FIG. 5), and interconnect portions of any other desired type may have a randomized or varying width (or any other desired property) along the length of the interconnect portion.

The interconnect portions of FIGS. 10B-15 and FIGS. 16B-17 may be referred to as non-periodic interconnect portions due to non-periodicity introduced by the various designs.

A number of possible arrangements have been shown for both the component mounting portion of the opaque footprint of a transparent display and the interconnect portions of the opaque footprint of a transparent display. In general, any of the component mounting portion arrangements may be used with any of the interconnect portion arrangements and vice versa. In other words, any of the component mounting portions of FIGS. 6-9 may be used in a display with any of the interconnect portions of FIGS. 10-17.

Figure 18A:
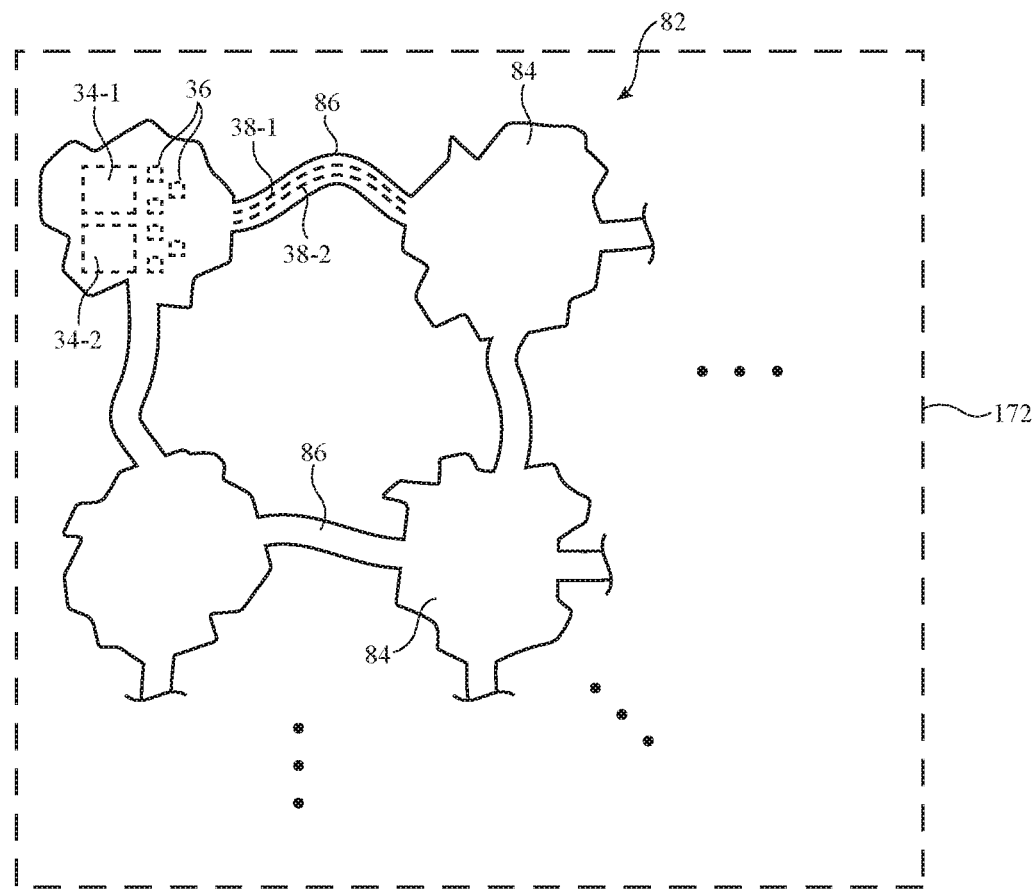
FIG. 18A is a top view of an illustrative unit cell for an opaque footprint for a display that includes component mounting portions having a random shape and interconnect portions having a random shape in accordance with an embodiment.

FIG. 18A shows one example of an opaque footprint that may be used for a display. The opaque footprint may have component mounting portions 84 having a random shape as discussed in connection with FIG. 7 and interconnect portions 86 having a random shape as discussed in connection with FIG. 13. The component mounting portions 84 and interconnect portions 76 may be arranged in a unit cell 172. Each component mounting portion in unit cell 172 has a unique random shape that may be generated using the techniques of FIG. 7. Each interconnect portion 86 in unit cell 172 has a unique random shape that may be generated using the techniques of FIG. 13. Unit cell 172 may have any desired number of unique component mounting portions and interconnect portions.

Each component mounting portion 84 may be overlapping with components such as driver integrated circuits 34-1 and 34-2 and light-emitting diodes 36. In some cases, driver integrated circuits 34-1 and 34-2 may form part of the opaque footprint. Alternatively or in addition, one or more metal layers (e.g., metal layers 52, 54, 56, and/or 58) in FIG. 3 may define the opaque footprint. In one illustrative example, metal layer 58 of FIG. 3 defines the opaque footprint.

Each interconnect portion 86 may be overlapping with signal paths such as signal paths 38-1 and 38-2. In some cases, signal paths such as signal paths 38-1 and 38-2 may define some or all of the opaque footprint in interconnect portion 86. Alternatively, one or more metal layers (e.g., metal layers 52 and/or 58 in FIG. 3) that are overlapping with the signal paths may define the opaque footprint. In one illustrative example, metal layer 58 of FIG. 3 defines the opaque footprint in the interconnect portion 86.

The unit cell 172 of random component mounting portion shapes that is repeated across the display may have 9 unique shapes (as in FIG. 8), 4 unique shapes (e.g., a 2×2 grid), 25 unique shapes (e.g., a 5×5 grid), 100 unique shapes (e.g., a 10×10 grid), more than 50 unique shapes, more than 100 unique shapes, less than 200 unique shapes, between 50 and 150 unique shapes, between 10 and 150 unique shapes, etc. Every interconnect portion within the unit cell may have its own unique shape. In general, increasing the number of unique random shapes that is included in the unit cell will reduce diffraction artifacts. However, increasing the number of unique random shapes that is included in the unit cell may also increase manufacturing complexity. Therefore, these factors may be prioritized and the unit cell size may be selected based on the particular display design.

Figure 18B:
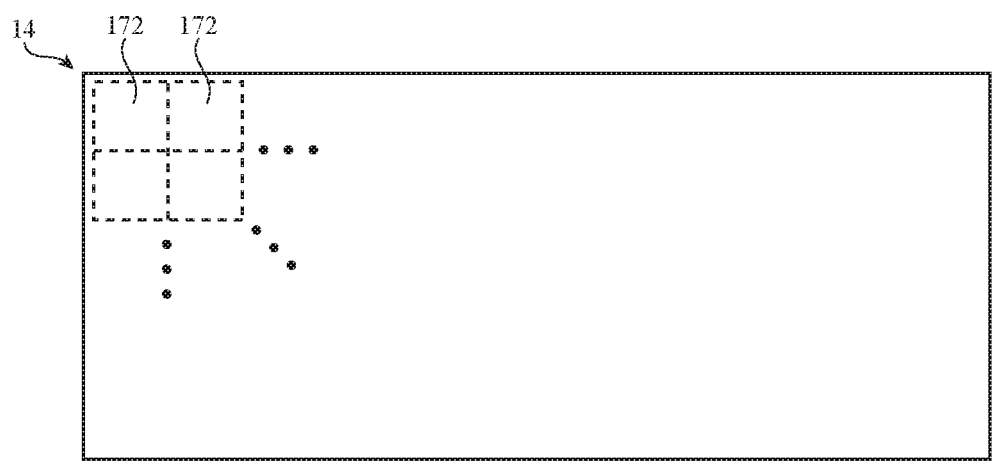
FIG. 18B is a top view of an illustrative display showing how the unit cell of FIG. 18A may be repeated across the display in accordance with an embodiment.

As shown in FIG. 18B, the unit cell (of whatever size is selected for the particular design) may be repeated across the display. Therefore, diffractive visible artifacts may be mitigated across the entire display due to the lack of periodicity in the opaque footprint across the display.

The example mentioned herein of diffraction artifacts being mitigated in a transparent display having bottom-emitting light-emitting diodes is merely illustrative. The aforementioned techniques to reduce periodicity and mitigate visible artifacts caused by diffraction may be applied to any display where visible artifacts caused by diffraction may occur. For example, these techniques may be applied to a transparent display having top-emitting light-emitting diodes, may be applied to a transparent liquid crystal display, or may be applied to a transparent display using any other desired type of display technology. The aforementioned techniques may also be applied to non-transparent displays that have diffraction artifacts. For example, reflective displays may also have diffraction artifacts caused by diffraction of the light reflected off the display.

Figure 19:
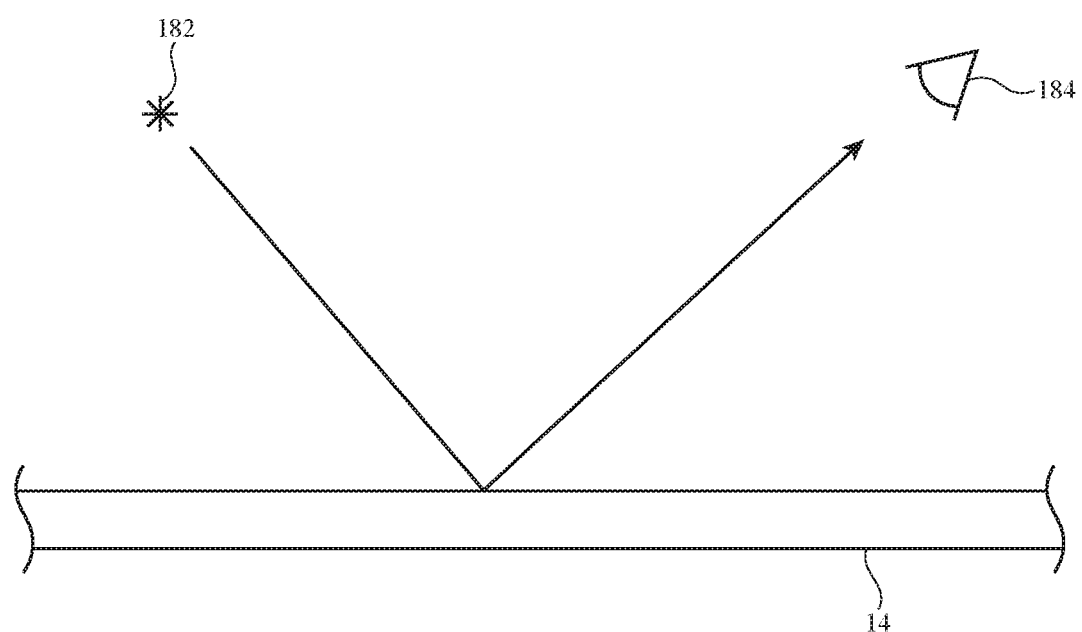
FIG. 19 is a cross-sectional side view of an illustrative reflective display that includes an opaque footprint with non-periodic structures to mitigate diffraction artifacts of reflected light in accordance with an embodiment.

FIG. 19 is a cross-sectional side view of an illustrative reflective display that may include an opaque footprint of the type shown herein to mitigate diffraction artifacts. As shown in FIG. 19, display 14 may reflect light from a light source 182 to a viewer 184. Reflective display 14 may also possess periodic elements that can cause visible diffraction when illuminated by environmental light (e.g., diffraction of the light reflected off the display causes visible artifacts). If the periodic opaque elements of reflective display 14 have a repeating pattern (e.g., similar to as in FIG. 5), diffractive artifacts may be highly visible. The diffractive artifacts may be visible when the display is not emitting light (e.g., when the display is off or black). The diffractive artifacts may also be visible when the display is emitting light (due to the diffractive artifact light combining in an undesirable way with the light emitted from the display).

To mitigate diffractive artifacts in the reflective display, opaque footprints having non-periodic optical elements (e.g., any of the mitigating features shown in FIGS. 6-18 as previously discussed) may be used in the display of FIG. 19.

Figure 20:
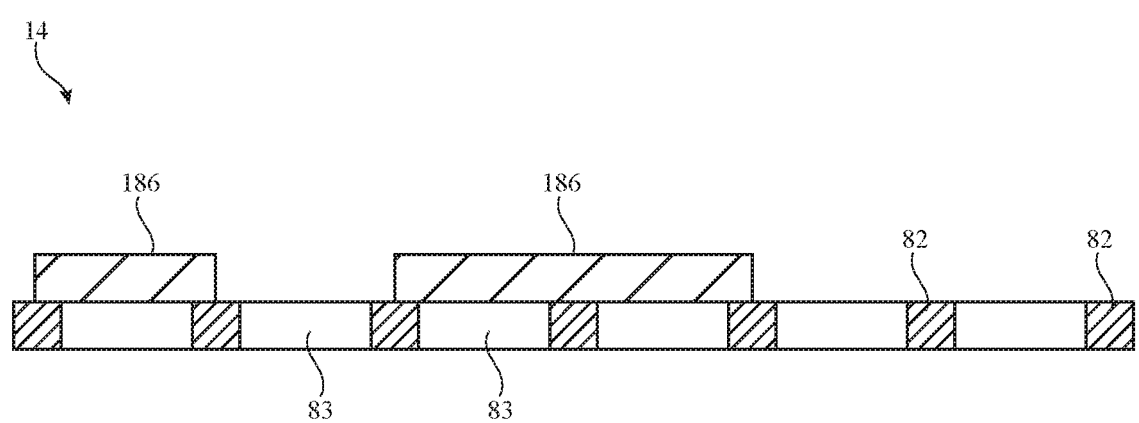
FIG. 20 is a cross-sectional side view of an illustrative display with transparent patches to cause a selective phase shift across the display to mitigate diffraction artifacts in accordance with an embodiment.

Another way to mitigate visible artifacts caused by diffraction is shown in FIG. 20. In particular, transparent patches may be selectively formed over the display to selectively create a phase shift in the light that is reflected by or transmitted through the display. As previously discussed, the display may be either a transparent display or a reflective display. In either scenario, the display may have an opaque footprint 82 as discussed in connection with FIGS. 5-18 (e.g., a footprint that does not transmit or does not reflect light, depending upon the type of display used). FIG. 20 is a cross-sectional side view showing how the display has opaque portions that form opaque footprint 82 and additional portions 83 (e.g., transparent portions 83 in a transparent display or reflective portions 83 in a reflective display, sometimes referred to as openings 83). Openings 83 may be selectively covered by transparent patches 186.

Transparent patches 186 may be formed over a subset of the transparent/reflective openings 83 in display 14 (e.g., approximately 50% of the openings, between 40% and 60% of the openings, more than 30% of the openings, less than 70% of the openings, between 25% and 75% of the openings, etc.). The example in FIG. 20 of each opening being either completely covered or completely uncovered by a transparent patch is merely illustrative. If desired, a transparent/reflective opening in the opaque footprint may be partially covered by a transparent patch. In general, the transparent patches may cover approximately 50% of the area of the openings, between 40% and 60% of the area of the openings, more than 30% of the area of the openings, less than 70% of the area of the openings, between 25% and 75% of the area of the openings, etc. The coverage of the transparent patches across the display may be random. The transparent patches may create a phase shift of the light transmitted through or reflected by the display. The target phase shift caused by the transparent patches may be 180°. However, this example is merely illustrative. In general, the transparent patches may cause a phase shift of greater than 135°, greater than 150°, greater than 160°, greater than 170°, etc. The selective phase shifting of the light may result in the light passing through the opaque footprint being more diffuse (e.g., mitigating artifacts caused by strong diffractive peaks).

The patches may be formed from a dielectric layer that is formed over the transparent/reflective openings of the display. The dielectric layer may be etched to be removed over some of (e.g., approximately half) the openings. The example in FIG. 20 of the transparent patches having a thickness that follows a step function (e.g., either patches with a first thickness or areas where the transparent material is totally removed) is merely illustrative. If desired, a transparent layer that forms patches 186 may have a gradually varying thickness in certain areas (e.g., the edges of each patch may have a tapered thickness). The material used to form the transparent patches may be isotropic or birefringent. In addition to patches of transparent material, the phase shift may also be realized by changing the height or thickness of components in the non-opaque regions of the display (e.g., by selectively modifying a thickness of a reflective or transparent layer that is uncovered by the opaque footprint).

In transparent displays, the transparent patches may be designed to cause a target phase shift (e.g., a 1800 phase shift) in one pass. In reflective displays, the transparent patches may be designed to cause a target phase shift (e.g., a 1800 phase shift) in two passes.

The example of using transparent patches to cause the selective phase shift for diffractive artifact mitigation is merely illustrative. In other examples, an existing layer in the display (e.g., substrate 30, dielectric layer 42, dielectric layer 44, dielectric layer 46, etc.) may have a modified thickness to cause a phase shift difference across the display. In yet another example, the transparent patches are formed by a patterned coating on top of a base film (e.g., a transparent base film having a uniform thickness).

The foregoing is merely illustrative and various modifications can be made to the described embodiments. The foregoing embodiments may be implemented individually or in any combination.

What is claimed is:

1. A display comprising:
   a transparent substrate;
   a plurality of light-emitting components mounted on the transparent substrate, wherein the plurality of light-emitting components comprises a plurality of bottom-emitting light-emitting diodes that are configured to emit light through the transparent substrate;
   at least one opaque layer that defines an opaque footprint on the transparent substrate, wherein the opaque footprint comprises non-periodic portions that mitigate diffraction artifacts; and
   a dielectric layer interposed between at least one bottom-emitting light-emitting diode of the plurality of bottom-emitting light-emitting diodes and the transparent substrate, wherein the at least one opaque layer comprises a metal layer that is interposed between the dielectric layer and the transparent substrate.

2. The display defined in claim 1, wherein the opaque footprint comprises component mounting portions and wherein each component mounting portion overlaps at least one respective light-emitting component of the plurality of light-emitting components.

3. The display defined in claim 2, wherein the non-periodic portions of the opaque footprint comprise the component mounting portions and wherein each component mounting portion has a random shape.

4. The display defined in claim 3, wherein each random shape has a center and a plurality of vertices, wherein each vertex of the plurality of vertices is separated from the center by a respective distance, and wherein there are at least six unique distances between the vertices and the center.

5. The display defined in claim 3, wherein each random shape has a perimeter that includes anchor points that are within a given distance from a reference circle having a radius and wherein the given distance is equal to 30% of a magnitude of the radius.

6. The display defined in claim 3, wherein the component mounting portions are arranged in a unit cell, wherein a number of uniquely shaped component mounting portions included in the unit cell is greater than four, and wherein the unit cell is repeated across the opaque footprint.

7. The display defined in claim 1, wherein the at least one opaque layer comprises a first opaque layer that overlaps a first light-emitting component of the plurality of light-emitting components and wherein the first light-emitting component is configured to emit light away from the first opaque layer.

8. A display comprising:
   a transparent substrate;
   a plurality of light-emitting components mounted on the transparent substrate;
   at least one opaque layer that defines an opaque footprint on the transparent substrate, wherein the opaque footprint comprises non-periodic portions that mitigate diffraction artifacts, wherein the opaque footprint comprises component mounting portions, wherein each component mounting portion overlaps at least one respective light-emitting component of the plurality of light-emitting components, and wherein the component mounting portions each have a base shape with edges and opaque patches surrounding the base shape that form an opacity gradient at the edges of the base shape.

9. A display comprising:
a transparent substrate;
a plurality of light-emitting components mounted on the transparent substrate;
at least one opaque layer that defines an opaque footprint on the transparent substrate, wherein the opaque footprint comprises non-periodic portions that mitigate diffraction artifacts, wherein the opaque footprint comprises component mounting portions, wherein each component mounting portion overlaps at least one respective light-emitting component of the plurality of light-emitting components, wherein the opaque footprint comprises interconnect portions that extend between the component mounting portions, and wherein the non-periodic portions of the opaque footprint comprise the interconnect portions.

10. The display defined in claim 9, wherein the interconnect portions extend along an axis that has a random shape.

11. The display defined in claim 9, wherein the interconnect portions are shifted by random distances relative to uniform grid lines for the opaque footprint.

12. The display defined in claim 9, wherein the interconnect portions are tilted at random angles relative to uniform grid lines for the opaque footprint.

13. The display defined in claim 9, wherein the interconnect portions have recesses.

14. The display defined in claim 9, wherein the interconnect portions have a repeated ring shape.

15. The display defined in claim 9, wherein the interconnect portions comprise opaque curved paths that are shifted relative to one another.

16. The display defined in claim 9, wherein the interconnect portions comprise opaque curved paths that each have a respective radius of curvature and wherein at least two of the opaque curved paths have different respective radii of curvature.

17. The display defined in claim 9, wherein the interconnect portions comprise an opaque curved path with different radii of curvature along a length of the opaque curved path.

18. The display defined in claim 9, wherein the plurality of light-emitting components comprises a plurality of top-emitting light-emitting diodes that are configured to emit light away from the transparent substrate.

19. A display comprising:
a substrate having component mounting regions;
a plurality of light-emitting diodes mounted on the substrate in the component mounting regions; and
at least one masking layer that defines an opaque footprint on the substrate, wherein the opaque footprint comprises a plurality of random shapes that overlap the component mounting regions and interconnect portions between the component mounting regions that follow random paths, and wherein the plurality of random shapes comprises a plurality of unique random shapes that are arranged in a unit cell that is repeated across the opaque footprint.

20. A display comprising:
a substrate having component mounting regions;
a plurality of light-emitting diodes mounted on the substrate in the component mounting regions;
at least one masking layer that defines an opaque footprint on the substrate, wherein the opaque footprint comprises a plurality of random shapes that overlap the component mounting regions and interconnect portions between the component mounting regions that follow random paths; and
transparent patches that selectively cover openings in the opaque footprint and cause a phase shift of light associated with those openings.

* * * * *